(12) United States Patent
Nishida

(10) Patent No.: US 9,622,395 B2
(45) Date of Patent: Apr. 11, 2017

(54) GUIDE VANE AND JETTING APPARATUS

(71) Applicant: Senju Metal Industry Co., Ltd., Tokyo (JP)

(72) Inventor: Shingo Nishida, Saitama (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

(21) Appl. No.: 14/397,483

(22) PCT Filed: Mar. 19, 2013

(86) PCT No.: PCT/JP2013/057832
§ 371 (c)(1),
(2) Date: Oct. 27, 2014

(87) PCT Pub. No.: WO2013/161453
PCT Pub. Date: Oct. 31, 2013

(65) Prior Publication Data
US 2015/0305216 A1  Oct. 22, 2015

(30) Foreign Application Priority Data
Apr. 27, 2012 (JP) ................. 2012-103249

(51) Int. Cl.
*B23K 3/06* (2006.01)
*B23K 1/08* (2006.01)
(Continued)

(52) U.S. Cl.
CPC ......... *H05K 13/0465* (2013.01); *B23K 1/085* (2013.01); *B23K 3/0653* (2013.01); *B23K 31/02* (2013.01); *H05K 3/3468* (2013.01)

(58) Field of Classification Search
None
See application file for complete search history.

(56) References Cited

FOREIGN PATENT DOCUMENTS

| JP | S63137570 A | 6/1988 |
|---|---|---|
| JP | H01143762 A | 6/1989 |

(Continued)

OTHER PUBLICATIONS

Japanese Patent Office, Decision to Grant a Patent issued re: Application No. 2012-103249, Jul. 22, 2014, 6 pages (including translation), Tokyo, Japan.

*Primary Examiner* — Devang R Patel
(74) *Attorney, Agent, or Firm* — Chernoff, Vilhauer, McClung & Stenzel, LLP

(57) ABSTRACT

A guide vane has a devised guide configuration for changing a flow direction of molten solder. The guide vane comprises a half-cylindrical plate 11 having a prescribed inner surface shape and a prescribed height, being stood on a prescribed board and changing a flow direction of fluid; and a half-cylindrical plate 12 having a prescribed inner surface shape and a prescribed height, being stood on the board 13 on which the first member 11 is stood and changing the flow direction of the fluid as shown in FIG. 1. The half-cylindrical plate 11 and the half-cylindrical plate 12 are faced so that an inner surface of the half-cylindrical plate 11 is faced to an edge of the half-cylindrical plate 12 and an inner surface of the half-cylindrical plate 12 is faced to an edge of the half-cylindrical plate 11. This structure allows to jet the molten solder to a target place and uniformize a widthwise distribution of the jetting height of the molten solder.

10 Claims, 17 Drawing Sheets

(51) Int. Cl.
    *H05K 13/04*    (2006.01)
    *B23K 31/02*    (2006.01)
    *H05K 3/34*    (2006.01)

(56) References Cited

FOREIGN PATENT DOCUMENTS

| | | | |
|---|---|---|---|
| JP | 06-041722 Y | * | 8/1989 |
| JP | H01-114165 | | 8/1989 |
| JP | U1989114165 | | 8/1989 |
| JP | H03-14059 | | 2/1991 |
| JP | U1991014059 | | 2/1991 |
| JP | H10313171 A | | 11/1998 |
| JP | H11044409 A | | 2/1999 |
| JP | 4136887 B2 | | 8/2008 |
| JP | 2009019781 A | | 1/2009 |
| JP | 2010177287 A | | 8/2010 |
| WO | 2005035176 A1 | | 4/2005 |
| WO | 2006082960 A1 | | 8/2006 |
| WO | 2007116853 A1 | | 10/2007 |

* cited by examiner

GUIDE VANE AND JETTING APPARATUS

TECHNICAL FIELD

The present invention relates to a guide vane and a jetting apparatus being applicable for a wave soldering apparatus and the like that jets fluid toward an adherend, followed by changing the flow of the fluid from the horizontal direction to the vertical direction.

BACKGROUND

From the past, when electronic components are soldered to a prescribed surface of a printed circuit board, a wave soldering apparatus is often used. On a wave soldering apparatus, a jetting apparatus which jets molten solder to a printed circuit board is mounted. As shown in the Patent Documents 1 to 3, the jetting apparatus has a duct, a nozzle and a pump. In accordance with the jetting apparatus, the molten solder is sent to the nozzle through the duct by the pump. The nozzle jets the molten solder having a liquid surface level corresponding to the pump output. Thereby, the molten solder jetted from the nozzle makes it possible to solder the electric components to the printed circuit board.

As to a pump mounted on the jetting apparatus described above, a wave soldering apparatus is disclosed wherein the duct is connected to a pump housing over the screw pump and the molten solder is sent from the pump housing to the duct (see Patent Document 3).

In addition, as to a method of jetting the molten solder having the same height from a nozzle, some wave soldering apparatuses are disclosed. In a first wave soldering apparatus, multiple flow-crossing plates bent upward are provided inside of the duct, and the flow direction of the molten solder is compulsory changed from the horizontal direction to the vertical direction directly below the jetting surface (see Patent Document 4). In a second wave soldering apparatus, the top of the duct suspends multiple uniform-flow plates, and the flow direction of the molten solder is compulsory changed from the horizontal direction to the vertical direction directly below the jetting surface (see Patent Document 5). In a third wave soldering apparatus, multiple flow-turning plates bent upward are provided at the bottom of the duct, and the flow direction of the molten solder is compulsory changed from the horizontal direction to the vertical direction directly below the jetting surface (see Patent Document 6).

DOCUMENT FOR PRIOR ART

Patent Document

Patent Document 1: Japanese Patent No. 4136887
Patent Document 2: Republication No. WO2006/082960
Patent Document 3: Republication No. WO2007/116853
Patent Document 4: Japanese Patent Publication No. 2010-177287
Patent Document 5: Japanese Patent Publication No. H01-143762
Patent Document 6: Japanese Utility Model Publication No. H01-114165

SUMMARY OF THE INVENTION

Problems to be Solved by the Invention

By the way, according to conventional examples of the flow-crossing plate, the uniform-flow plate, the flow-turning plate and so on (hereinafter referred to as the "guide vane") and the jetting apparatus with the guide vane, there are problems as follows:

i. According to the guide vane as described in Patent Documents 4 to 6, the multiple guide vanes bent upward change the flow of the molten solder (hereinafter referred to as "fluid") upward. However, in order to realize the same height of the jetting surface, the speed distribution of the fluid is needed to be uniformed directly below the jetting surface. Nevertheless, the fluid colliding against the guide vane is not turned completely upward because of the influence of horizontal inertia of the fluid in the duct. Therefore, it is an actual situation that the flow direction of the fluid is not able to be changed upward at an intended place.

ii. Also, according to the jetting apparatus to which the above-mentioned guide vane is mounted, because the influence of horizontal inertia of the fluid in the duct depends on the pump output, the speed distribution of the fluid directly below the jetting surface cannot be uniformed and the jetting height of the fluid is deviated in the direction of the nozzle's width. Thereby, there are problems that the widthwise distribution of the fluid jetting height jetted from the nozzle does not become uniform and the tendency variation becomes large in the widthwise distribution of the fluid from the pump output. Incidentally, this problem can be found in the wave soldering apparatus and the like on which the above-mentioned jetting apparatus is mounted.

Then, this invention solves such problems and has an object to provide the guide vane and the jetting apparatus which allows to jet the fluid to the target position and allows to uniformize the widthwise distribution of the fluid jetting height by means of devising the structure of the guide member which changes the flow direction of the fluid.

Means for Solving the Problems

To solve the problems, a guide vane of claim 1 is characterized in that multiple pair structures are provided; each of said structures comprises a first member having a curvature or angular inner surface shape and having a prescribed height and a second member having a curvature or angular inner surface shape and having a prescribed height; said first and second members of said pair structure are arranged under a condition that said first and second members are shifted left or right in a view from a main flow direction of melted fluid; said pair structures are stood on a board in the main flow direction of the fluid; the fluid is flowed into an opening formed by edges of said first and second members; the flowed fluid is turned in said pair structure to change the fluid flow direction from a horizontal direction to a vertical direction.

According to the guide vane described in claim 1, the first member has the curvature or angular inner surface shape and the prescribed height. The second member also has the curvature or angular inner surface shape and the prescribed height. With acceptance on this point, the multiple pair structures comprising the first members and the second members are provided; each of said structures comprises a first member having a curvature or angular inner surface shape and having a prescribed height and a second member having a curvature or angular inner surface shape and having a prescribed height; said first and second members of said pair structure are arranged under a condition that said first and second members are shifted left or right in a view from a main flow direction of melted fluid; said pair structures are stood on a board in the main flow direction of the fluid; the fluid is flowed into an opening formed by edges of said first and second members; the flowed fluid is turned in said pair structure to change the fluid flow direction from a horizontal direction to a vertical direction.

In accordance with this arrangement, since said fluid is flowed into the opening formed by both the edges of the first and second members having the inner surfaces faced each other, the flowed fluid becomes the spiral flow along the inner surfaces of said pair structure and thereby rises.

The guide vane described in claim 4 is characterized in that, in the description of claim 1, each of said first member and said second member comprises any one of a half-cylindrical, L-shape cross section and U-shape cross section screen plate.

The jetting apparatus described in claim 5 comprises a nozzle having a prescribed opening for jetting melted fluid; a pump for sending the fluid into said duct; a pump housing receiving said pump and being connected to said duct; and a guide vane described in claim 1, said guide vane being provided in said duct and turning the flow direction of the fluid sent by said pump and flowed in the longitudinal direction of said duct to change the flow of the fluid to a height direction of said nozzle.

According to the jetting apparatus of claim 5, the nozzle has the prescribed opening and jets the melted fluid. The duct is connected to the nozzle. The pump housing receiving the pump is connected to the duct and the pump sends the melted fluid into the duct. The guide vane is placed in the duct. With acceptance on this point, the guide vane according to the present invention is adapted to turn the flow of the melted fluid sent by the pump and flowed from the longitudinal direction of the duct and to change the fluid flow to the height direction of the nozzle.

In Claim 6, the jetting apparatus according to Claim 5 is characterized in that an angle between the longitudinal direction of the duct and the longitudinal direction of the guide vane is set and the guide vane is attached to the duct at the angle set here wherein the duct is connected to the pump housing and the fluid is sent by the pump.

In Claim 7, the jetting apparatus according to Claim 6 is characterized in that the duct, to which the fluid is sent by the pump, includes a thin and long case having an inlet port, an outlet port, and an end port that are provided in prescribed places; the inlet port is provided on one side of the case; the pump housing is connected to the inlet port; an inflow regulating plate is provided on the prescribed place of the inlet port for regulating the fluid to flow into the inflow port in one opening width of the guide vane; the outlet port is positioned above the guide vane, opened at the top plate of the case and connected with the nozzle; and the fluid having the flow direction reversed by the end port is made to flow into the inflow port in the other opening width of the guide vane.

The jetting apparatus described in claim 8 is characterized in that, in claim 7, an inclined portion is provided at the part of connecting said pump housing and said duct, and said pump sends the fluid into said duct through said inclined portion.

Effects of the Invention

According to the guide vane relating to this invention, the multiple pair structures are provided. Each of the pair structures comprises the first curvature or angular member having the prescribed height and the second curvature or angular member having the prescribed height. The first and second members of the pair structure are arranged under a condition that the first and second members are shifted left or right in a view from the main flow direction of the melted fluid. The pair structures are stood on the board in the main flow direction of the fluid. The melted fluid is flowed into the opening formed by both the edges of said first and second members that face to each other. The molten inflow fluid is turned to change the fluid flow direction from the horizontal direction to the vertical direction.

In accordance with this structure, when the melted fluid flows into the opening formed by both the edges of the first and second members having inner surfaces faced each other, the melted fluid flowed in comes to turn in the pair structure comprising the first and second members to rise along the inner surfaces thereof. Thereby, the flow of the melted fluid flowed horizontally into the opening can be changed to the vertical direction flow. This guide vane is sufficiently applicable to the jetting apparatus.

The jetting apparatus of this invention, comprises the guide vane of the present invention and is adapted to change the flow direction of the melted fluid from the horizontal direction to the vertical direction in the duct. This constitution enables the widthwise distribution of the melted fluid jetting height jetted from the nozzle to be uniformized. Further, the tendency change of the widthwise distribution of the melted fluid from the pump output can be reduced.

EMBODIMENTS FOR CARRYING OUT THE INVENTION

The guide vane and the jetting apparatus as the embodiments according to the present invention will be explained hereinafter with reference to the figures.

Figure 1:
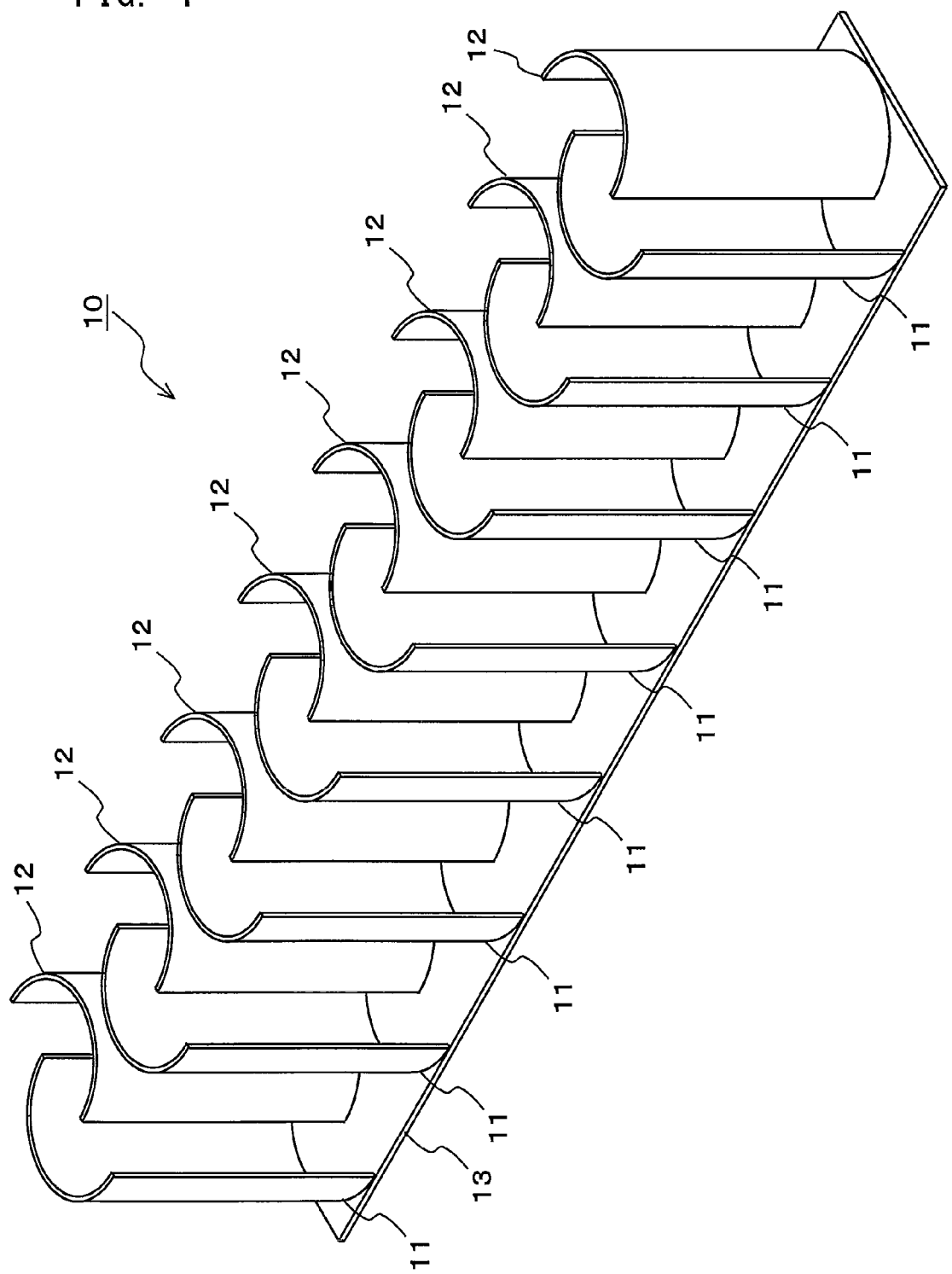
FIG. 1 is a perspective view for showing a configuration example of a half-cylindrical guide vane 10 as the first embodiment according to the present invention.

A guide vane 10 according to a first embodiment shown in FIG. 1 has multiple, for example, eight pieces of half-cylindrical screen plate (hereinafter referred to as the "half-cylindrical plate 11") which are examples of first members and, similarly, eight pieces of half-cylindrical plate 12 which are examples of second members. The half-cylindrical plate 11 has a half-cylindrical inner surface in its inside and a prescribed height h (see FIG. 2). The half-cylindrical plate 11 is stood on a prescribed board 13, changes a flow direction of fluid, and turns the fluid by cooperating with the half-cylindrical plate 12.

The half-cylindrical plate 12 also has a half-cylindrical inner surface in its inside and the prescribed height h. The half-cylindrical plate 12 is placed on the board 13 where the half-cylindrical plate 11 is stood on, changes the flow direction of the fluid and turns the fluid by cooperating with the half-cylindrical plate 11. A stainless material (SUS304, SUS316 and so on) having a prescribed thickness t is used for the half-cylindrical plates 11, 12 and the board 13. The half-cylindrical plate 11 and the half-cylindrical plate 12 are faced each other so that the inner surface of the half-cylindrical plate 11 is faced to an edge of the half-cylindrical plate 12 and the inner surface of the half-cylindrical plate 12 is faced to an edge of the half-cylindrical plate 11.

Figure 2:
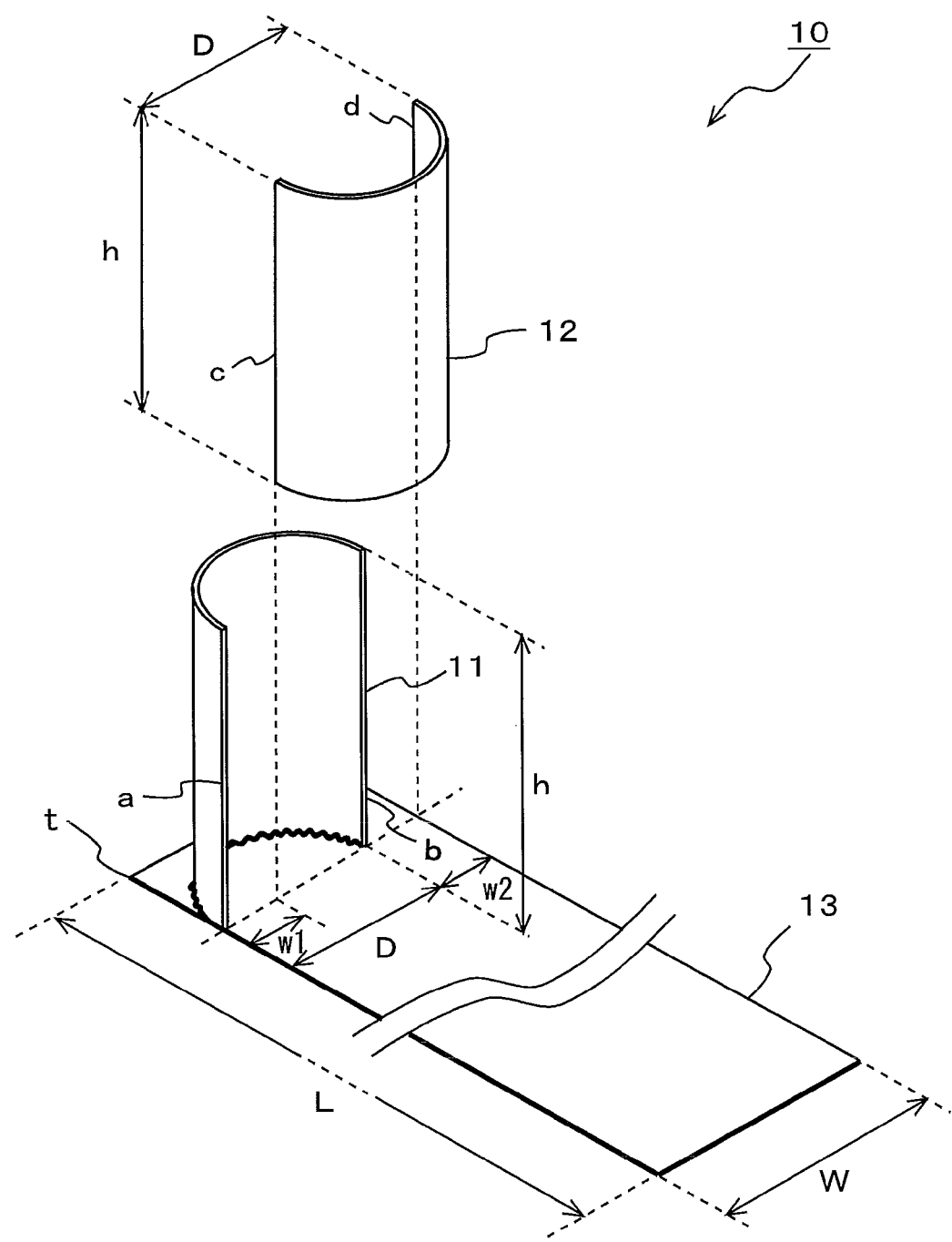
FIG. 2 is a perspective view for showing a formation example of the guide vane 10.

Then, a formation example of the guide vane 10 will be described with reference to FIG. 2. According to the guide vane 10 shown in FIG. 2, first, a stainless tube having a prescribed length, a diameter D=about 50 mmφ and thickness t=about 2 mm is prepared. Next, when a height of the guide vane 10 is h, the stainless tube is cut in the direction of the length to make the height h=about 85 mm. In addition, the stainless tube is cut in a longitudinal direction to make the half-cylindrical plates 11, 12 as half-cylindrical screen plates. Eight pieces are prepared for the half-cylindrical plates 11 and 12 respectively. Now that, in this case, the illustrated example is that the half-cylindrical plate 11 and the half-cylindrical plate 12 have the same shape.

Next, a board material made of stainless is prepared. Assuming that a length of the board 13 is L, its width is W and its thickness is t, the length L is about 420 mm, the width W is about 70 mm and the thickness t is about 2 mm. In this example, the half-cylindrical plate 11 and the half-cylindrical plate 12 are shifted to right or left with respect to a main flow direction by a length D−w2 (=D−w1) shorter than D+w2 (=D+w1) that is a distance between the both edges of the half-cylindrical plate 11 and the half-cylindrical plate 12 (the edge a-the edge d). The pair structure is made so that a pair of the half-cylindrical plate 11 and the half-cylindrical plate 12 face each other. Then, the eight pairs of the half-cylindrical plate 11 and the half-cylindrical plate 12 are stood on the board 13 along a main flow direction of the board 13.

W1 in this figure represents the opening width defined by one edge a of the half-cylindrical plate 11 and one edge c of the half-cylindrical plate 12. W2 represents the opening width defined by the other edge b of the half-cylindrical plate 11 and the other edge d of the half-cylindrical plate 12. In this example, since the half-cylindrical plate 11 and the half-cylindrical plate 12 have the same shape, w1=w2.

Next, the half-cylindrical plates 11, 12 are welded onto the board 13 by using an electric welding apparatus, a gas welder machine and so on. For example, a flux and a welding rod for the stainless are used, the welding rod is molten, and the half-cylindrical plates 11, 12 are electrically welded onto the board 13. In doing so, each bottom of the half-cylindrical plates 11, 12 and the board 13 are surely joined and fixed together. Accordingly, the guide vane 10 is completed as shown in FIG. 1.

Successively, an operation example of the guide vane 10 will be explained with reference to FIG. 3. According to the guide vane 10 shown in FIG. 3, the fluid flows into the first inflow port 14 having the opening width w1 defined by one edge a of the half-cylindrical plate 11 and one edge c of the half-cylindrical plate 12, and the fluid flows into the second inflow port 15 having the opening width w2 defined by the other edge b of the half-cylindrical plate 11 and the other edge d of the half-cylindrical plate 12.

The half-cylindrical plate 11 turns the horizontal flow direction of the fluid from the inflow port 14 clockwise to form a clockwise rising vortex, and changes the direction of the fluid upward by cooperating with the half-cylindrical plate 12. The half-cylindrical plate 12 also turns the flow of the horizontal fluid from the inflow port 15 clockwise in the same direction to form a clockwise rising vortex, and changes direction of the fluid upward by cooperating with the half-cylindrical plate 11.

In addition, the flow of the fluid in the inside of the pair of the half-cylindrical plates 11, 12 turns clockwise along the half-cylindrical inner surface and collides with the other half-cylindrical inner surface so that the pressure of the collision increases at that time. This increasing pressure makes resistance for the fluid flowing into the inside of the pair of the half-cylindrical plates 11, 12. Further, the faster the turning speed, the bigger the pressure becomes. Thus, they have an effect to uniformize the amount of flow into each pair of the half-cylindrical plates 11, 12.

According to the guide vane 10 of the first embodiment, the half-cylindrical plate 11 and the half-cylindrical plate 12 are arranged to face each other. Thus, the inner surface of the half-cylindrical plate 11 is faced to the edge c of the half-cylindrical plate 12 and the inner surface of the half-cylindrical plate 12 is faced to the edge b of the half-cylindrical plate 11.

In accordance with this arrangement, when the fluid flows into the inflow port 14 having the opening width w1 defined by one edge a of the half-cylindrical plate 11 and one edge c of the half-cylindrical plate 12 and the fluid flows into the inflow port 15 having the opening width w2 defined by the other edge b of the half-cylindrical 11 and the other edge d of the half-cylindrical plate 12, the fluid from the inflow port 14 and the inflow port 15 comes to the clockwise spiral flow and rises along the inner surfaces of the half-cylindrical plates 11, 12.

Thereby, the horizontal fluid flow to the inflow port 14 and the inflow port 15 can be changed to the vertical fluid flow. The guide vane 10 is sufficiently applicable to the wave soldering apparatus and the like.

Although the half-cylindrical plates 11, 12 include the inner surfaces of the half-cylindrical shape in the above-described example, the configuration is not restricted to this. For example, it is possible to provide at least one of spiral groove and protrusion on the half-cylindrical inner surfaces of the half-cylindrical plates 11, 12 and the like of the guide vane 10.

In this constitution, according to the latter with respect to the former, it can guide the fluid to be pushed up along the spiral groove and the protrusion so that it is easy to generate the rising clockwise spiral. Thereby, it is possible to convert the fluid flow into the first inflow port 14 and the second inflow port 15 of the guide vane 10 to the vertical flow at a target position.

Moreover, the half-cylindrical plate 11 and the half-cylindrical plate 12 have the same shape in the explained example. However, they may not be the same shape. If the inner surfaces are curved instead of the half-cylindrical shape, it has a similar effect. However, it is preferable that their heights are almost same in the height direction.

Embodiment 2

Figure 4A:
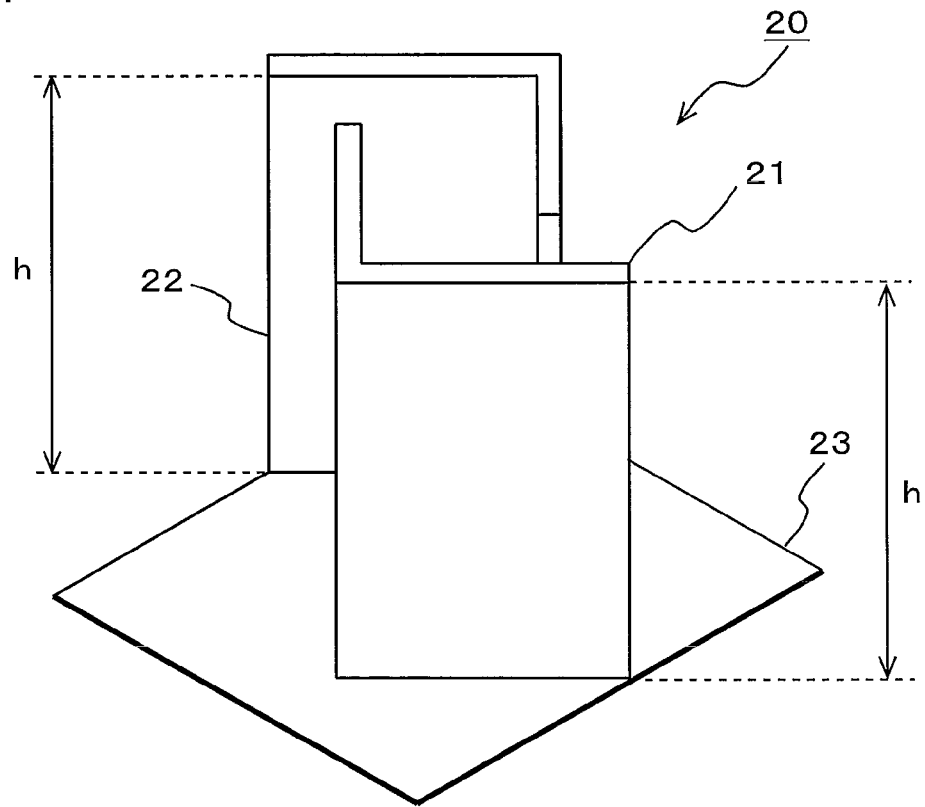
FIG. 4A is a perspective view for showing a configuration example of a guide vane 20 having an L-shaped cross section according to a second embodiment.

Successively, a constitutional example of a guide vane 20 having an L-shape cross section according to a second embodiment will be explained with reference to FIGS. 4A and 4B. The guide vane 20 shown in FIG. 4A is not the half-cylindrical shape as shown in the first embodiment but a pair of screen plates (hereinafter referred to as the "angle plates 21,22") having the L-shape cross sections (may be V-shape) are used as the first member and the second member.

The angle plate 21 includes a single angular inner surface in its inside and has the prescribed height h. The angle plate 21 is stood on the prescribed board 23, changes the flow direction of the fluid and turns the fluid clockwise by cooperating with the angle plate 22.

The angle plate 22 also includes a single angular inner surface in its inside and has the prescribed height h. The angle plate 22 is placed on the board 23 on which the angle plate 21 is stood. The angle plate 22 changes the flow direction of the fluid and turns the fluid clockwise by cooperating with the angle plate 21. The stainless material (SUS304, SUS316 and so on) having the prescribed thickness t is used for the angle plates 21, 22 and the board 23.

The angle plate 21 and the angle plate 22 are faced to each other wherein the inner surface of the angle plate 21 is faced to the edge of the angle plate 22 and the inner surface of the angle plate 22 is faced to the edge of the angle plate 21. In this example, the angle plate 21 and the angle plate 22 have the same shape.

Figure 4B:
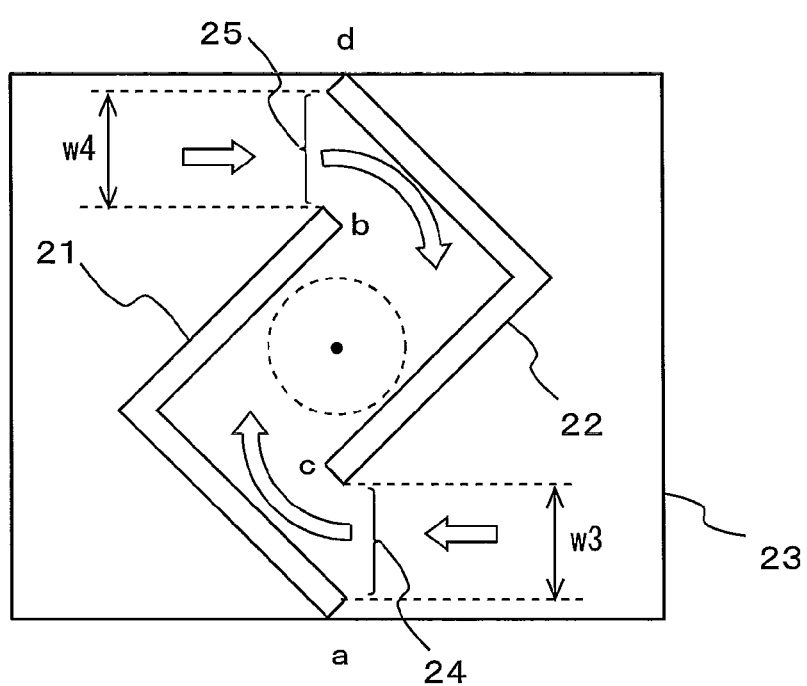
FIG. 4B is a top view for showing an operation example of the guide vane 20 having an L-shaped cross section according to the second embodiment.

According to the guide vane 20 shown in FIG. 4B, the fluid flows into a first inflow port 24 having the opening width w3 defined by one edge a of the angle plate 21 and one edge c of the angle plate 22. The fluid flows into the second inflow port 25 having the opening width w4 defined by the other edge b of the angle plate 21 and the other edge d of the angle plate 22. In this example, since the angle plate 21 and the angle plate 22 have the same shape, w3=w4.

The angle plate 21 turns the horizontal flow direction of the fluid from the inflow port 24 clockwise in the horizontal direction to form a clockwise rising vortex and changes the direction of the fluid upward by cooperating with the angle plate 22. The angle plate 22 also turns the horizontal flow direction of the fluid from the inflow port 25 clockwise in the same direction to form a clockwise rising vortex and changes the direction of the fluid upward by cooperating with the angle plate 21.

In addition, the flow of the fluid in the inside of the pair of the angle plates 21, 22 turns clockwise along the single angular inner surface and collides with the other side of the angular inner surface so that the pressure of the collision increases at that time. This increasing pressure makes resistance for the fluid flowing into the inside of the pair of the angle plates 21, 22. Further, the faster the turning speed, the bigger the pressure becomes. Thus, they have an effect to uniformize the amount of flow into each pair of the angle plates 21, 22.

Thus, according to the guide vane 20 of the second embodiment, the angle plate 21 and the angle plate 22 are arranged to face each other in order that the inner surface of the angle 21 faces to the edge c of the angle plate 22 and the inner surface of the angle plate 22 faces to the edge b of the angle plate 21.

In accordance with this arrangement, when the fluid flows into the inflow port 24 having the opening width w3 defined by one edge a of the angle plate 21 and one edge c of the angle plate 22 and the fluid flows into the inflow port 25 having the opening width w4 defined by the other edge b of the angle plate 21 and the other edge d of the angle plate 22, the fluid from the inflow port 24 and the inflow port 25 comes to the clockwise spiral flow and rises along the infer surfaces of the angle plates 21, 22.

Thereby, the horizontal flow direction of the fluid into the first inflow port 24 and the second inflow port 25 can be changed to the vertical flow direction at the target position. This guide vane 20 is sufficiently applicable to the jetting apparatus and the like.

In the above-mentioned embodiment, the angle plates 21, 22 having only one angular portion at their inner surfaces have been explained but it is not restricted to such configuration. For example, at least one of the spiral groove and the protrusion may be placed on the angular inner surfaces of the angle plates 21, 22 of the guide vane 20 and the like as explained in the first embodiment.

In this constitution, according to the latter with respect to the former, it can guide the fluid to be pushed up along the spiral groove and the protrusion so that it is easy to generate the rising clockwise spiral. Thereby, it is possible to convert the fluid flow into the first inflow port 24 and the second inflow port 25 of the guide vane 20 to the vertical flow at a target position with sufficient repeatability.

Moreover, the angle plate 21 and the angle plate 22 have the same shape in the explained example, but they may not be the same shape to have a similar effect. However, it is preferable that their heights are almost same in the height direction.

Embodiment 3

Figure 5A:
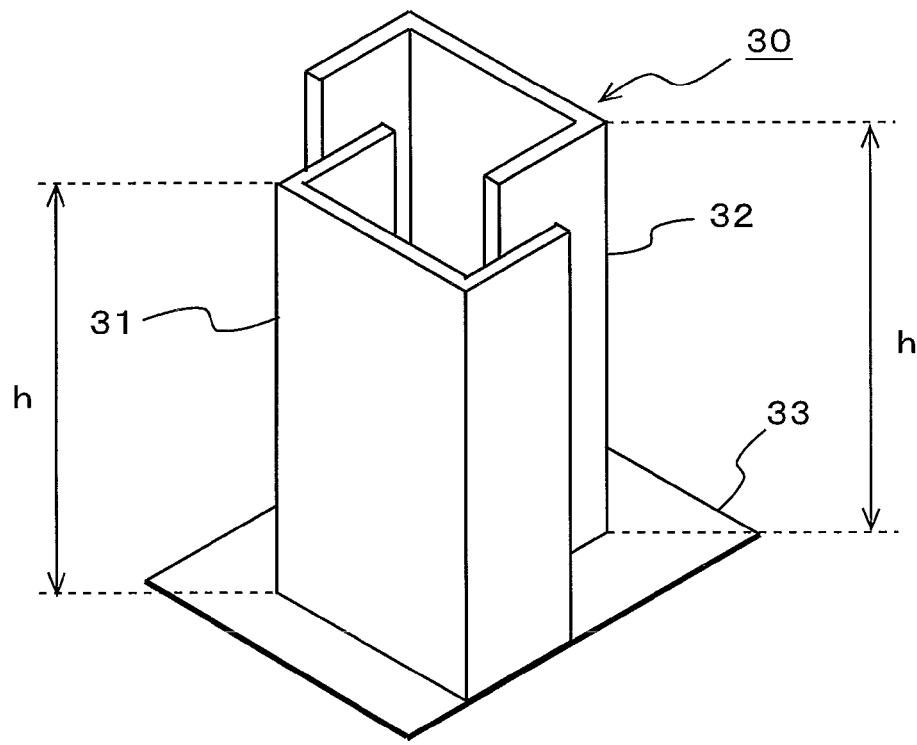
FIG. 5A is a perspective view for showing a configuration example of a guide vane 30 having a U-shaped cross section according to the third embodiment.

Successively, a constitutional example of a guide vane 30 having a U-shaped cross section according to a third embodiment will be explained with reference to FIGS. 5A and 5B. The guide vane 30 shown in FIG. 5A is not the single angular portion as shown in the second embodiment but screen plates (hereinafter referred to as the "channel plates 31, 32") having the U-shape cross sections are used as the first member and the second member.

The channel plate 31 has an inner surface having multiple angular portions in its inside and the prescribed height h. The channel plate 31 is stood on the prescribed board 33, changes the flow direction of the fluid and turns the fluid clockwise by cooperating with the channel plate 32.

The channel plate 32 also includes an inner surface having multiple angular portions in its inside and the prescribed height h. The channel plate 32 is placed on the board 33 on which the channel plate 31 is stood. The channel plate 32 changes the flow direction of the fluid and turns the fluid clockwise by cooperating with the channel plate 31. The stainless material (SUS303 and so on) having the prescribed thickness t is used for the channel plates 31, 32 and the board 33.

The channel plate 31 and the channel plate 32 are faced to each other wherein the inner surface of the channel plate 31 is faced to the edge c of the channel plate 32 and the inner surface of the channel plate 32 is faced to the edge b of the channel plate 31.

Figure 5B:
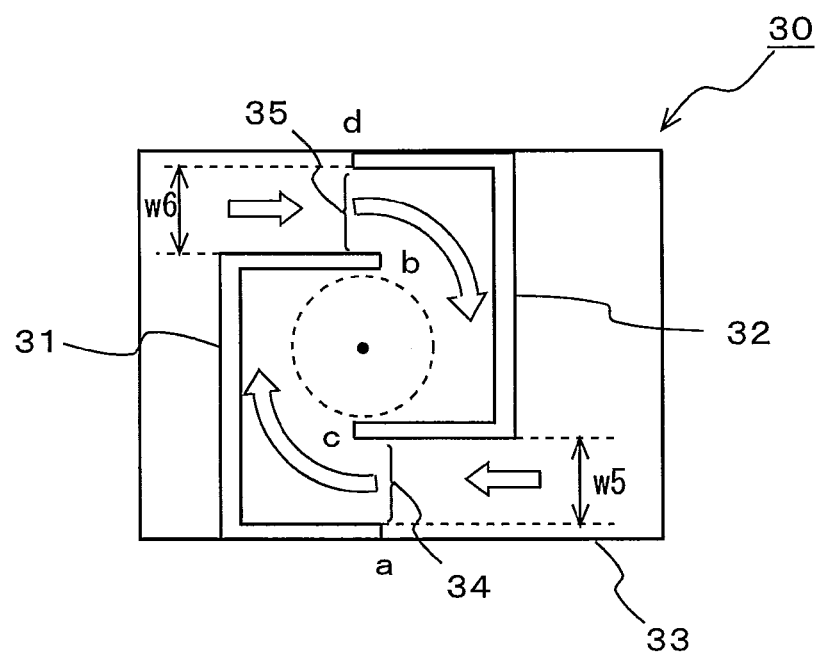
FIG. 5B is a top view for showing an operation example of the guide vane 30 having the U-shaped cross section according to the third embodiment.

According to the guide vane 30 shown in FIG. 5B, the fluid flows into a first inflow port 34 having the open Mg width w5 defined by one edge a of the channel plate 31 and one edge c of the channel plate 32. The fluid flows into the second inflow port 35 having the opening width w6 defined by the other edge b of the channel plate 31 and the other edge d of the channel plate 32.

The channel plate 31 turns the horizontal flow direction of the fluid from the inflow port 34 clockwise in the horizontal direction to form a clockwise rising vortex and changes the direction of the fluid upward by cooperating with the channel plate 32. The channel plate 32 also turns the horizontal flow direction of the fluid from the inflow port 35 clockwise in the same direction to form a clockwise rising vortex and changes the direction of the fluid upward by cooperating with the channel plate 31.

In addition, the flow of the fluid in the inside of the pair of the channel plates 31, 32 turns clockwise along the inner surface having the multiple angular portions and collides with the other side of the angular inner surface so that the pressure of the collision increases at that time. This increasing pressure makes resistance for the fluid flowing into the inside of the pair of the channel plates 31, 32. Further, the faster the turning speed, the bigger the pressure becomes. Thus, they have an effect to uniformize the amount of flow into each pair of the channel plates 31, 32. In this example, the channel plate 31 and the channel plate 32 have the same shape.

Thus, according to the guide vane 30 of the third embodiment, the channel plate 31 and the channel plate 32 are arranged to face each other in order that the inner surface of the channel plate 31 faces to the edge c of the channel plate 32 and the inner surface of the channel plate 32 faces to the edge b of the channel plate 31.

In accordance with this arrangement, when the fluid flows into the inflow port 34 having the opening width w5 defined by one edge a of the channel plate 31 and one edge c of the channel plate 32 and the fluid flows into the inflow port 35 having the opening width w6 defined by the other edge b of the channel plate 31 and the other edge d of the channel plate 32, the fluid from the inflow port 34 and the inflow port 35 comes to the clockwise spiral flow and rises along the infer surfaces of the channel plates 31, 32. In this example, since the channel plate 31 and the channel plate 32 have the same shape, w5=w6.

Thereby, the horizontal flow direction of the fluid into the first inflow port 34 and the second inflow port 35 can be changed to the vertical flow direction at the target position. This guide vane 30 is sufficiently applicable to the jetting apparatus, the confectionery producing apparatus and like.

In the above-mentioned embodiment, the channel plates 31, 32 having the multiple angular portions at their inner surfaces have been explained but it is not restricted to such configuration. For example, at least one of the spiral groove and the protrusion may be placed on the inner surfaces having the multiple angular portions of the channel plates 31, 32 of the guide vane 30 and the like as explained in the first embodiment.

In this constitution, according to the latter with respect to the former, it can guide the fluid to be pushed up along the spiral groove and the protrusion so that it is easy to generate the rising clockwise spiral. Thereby, it is possible to convert the fluid flow into the first inflow port 34 and the second inflow port 35 of the guide vane 30 to the vertical flow at a target position. Moreover, the channel plate 31 and the channel plate 32 have the same shape in the explained example, but they may not be the same shape to have a similar effect. However, it is preferable that their heights are almost same in the height direction.

In the above description, the screen plates are selected from the pair of the half-cylindrical shape, the L-shape cross section shape and the U-shape cross section shape plates as the first member and the second member acting as the guide vanes 10, 20, 30. However, the half-cylindrical screen plates as the first member may be used by combining with the L-shape cross section screen plates as the second member. When combining the different shape screen plates for use, it is preferable that the screen plates have almost the same height.

Embodiment 4

Figure 6:
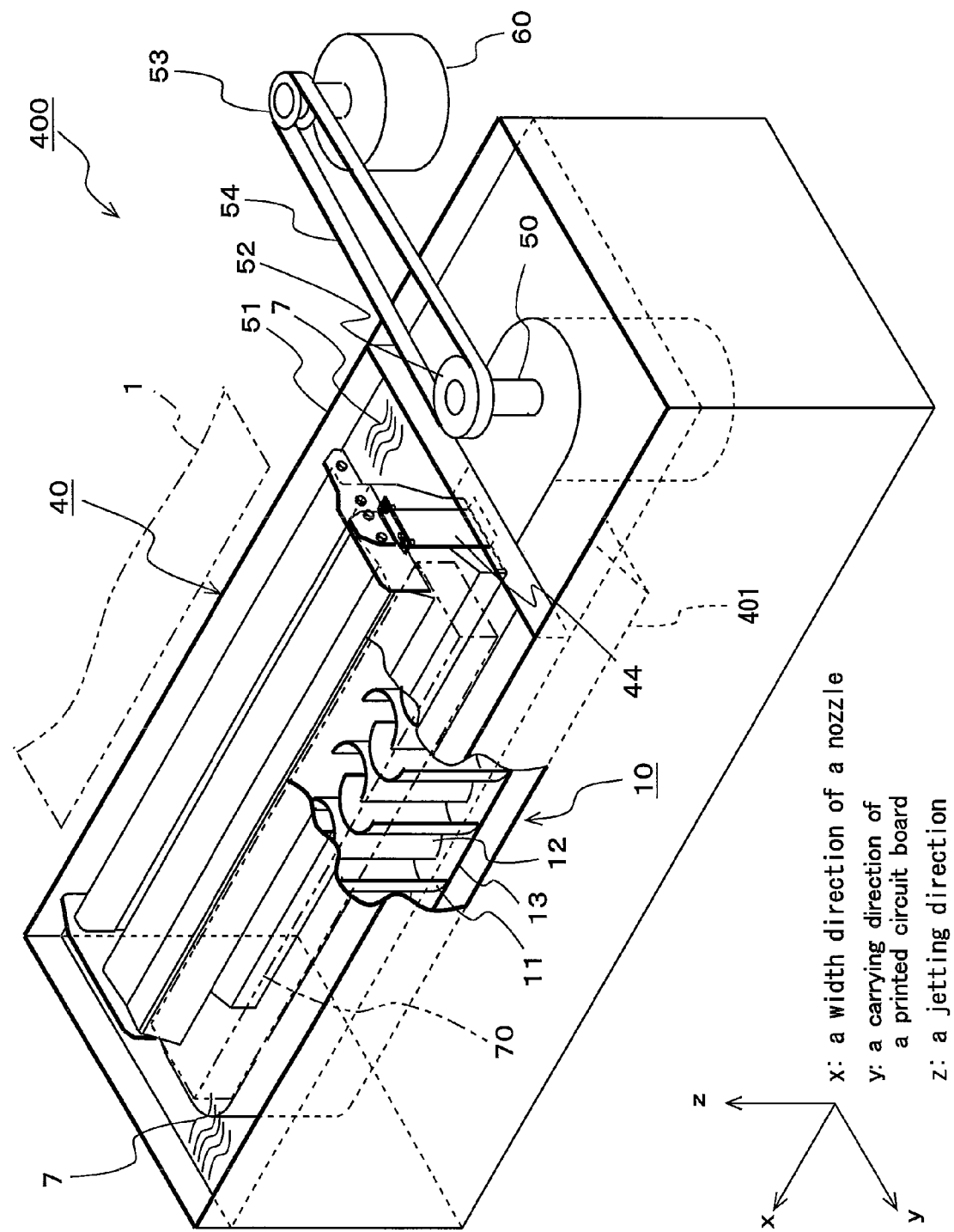
FIG. 6 is a perspective view for showing a configuration example that applied the jetting apparatus of the present invention to a wave soldering apparatus 400 according to the fourth embodiment.

Successively, a configuration example of a wave soldering apparatus 400 of the forth embodiment will be explained with reference to FIG. 6 and FIG. 7. The wave soldering apparatus 400 shown in FIG. 6 jets melted fluid (hereinafter referred to as "molten solder 7") to a prescribed surface of a printed circuit board 1 and solders electronic components on the printed circuit board 1. The wave soldering apparatus 400 comprises the guide vane 10, a jetting apparatus 40, a pump 50, a solder bath 51 and a motor 60. The solder bath 51 comprises a case whose top surface opens and accommodates the molten solder 7. A heater, not shown in the figures, is provided at the solder bath 51 to keep a temperature of the molten solder 7 constant. The jetting apparatus 40 is mounted in the solder bath 51 to be dipped into the molten solder 7. The jetting apparatus 40 comprises a duct 41, a nozzle 42, a platform 43, a mounting brackets 44, 45 (see FIG. 11) and an inflow regulating plate 46 as shown in FIG. 7.

Figure 7:
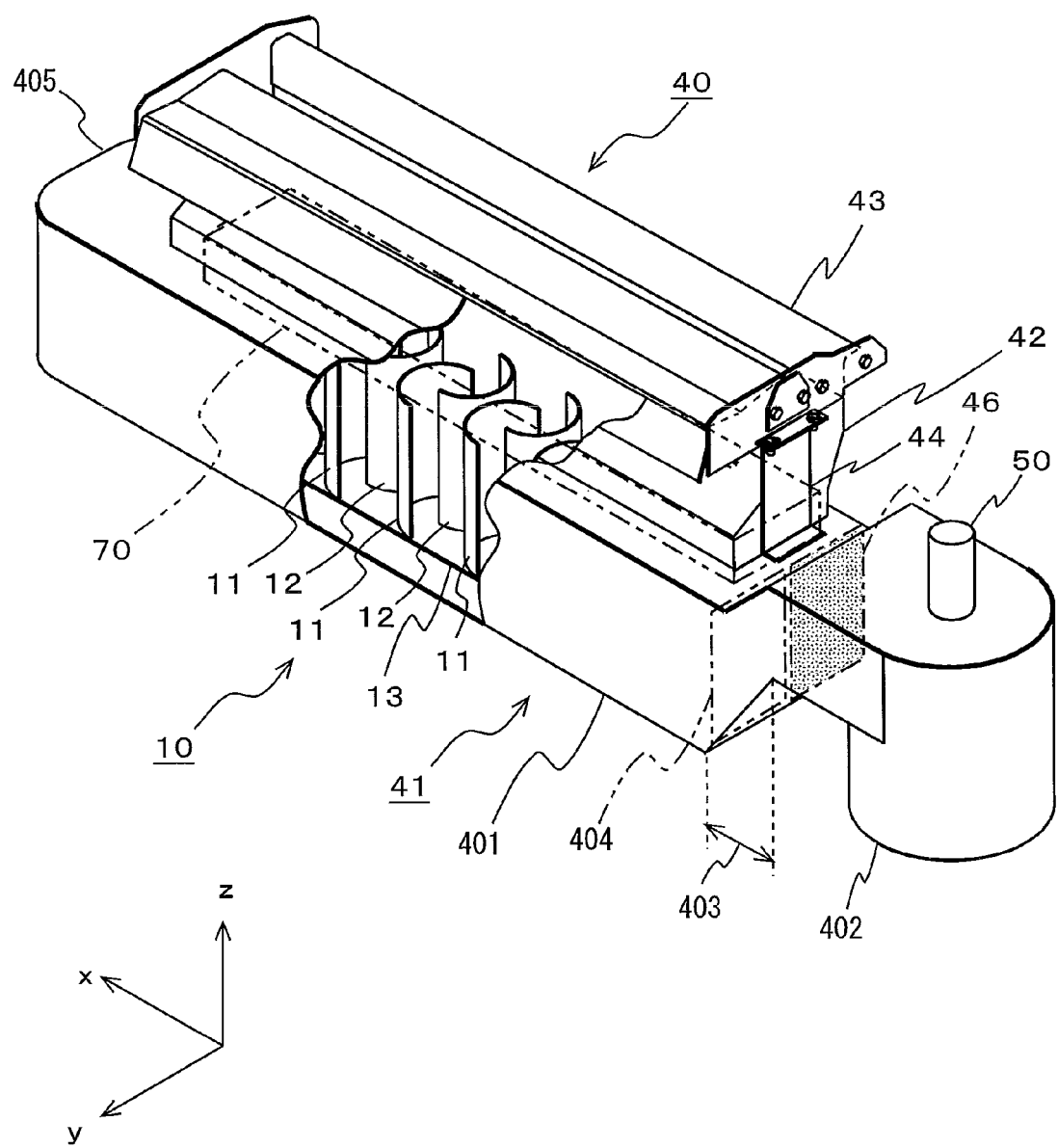
FIG. 7 is a perspective view for showing a configuration example of a jetting apparatus 40.

The duct 41 has a body 401 that is a thin and long case as shown in FIG. 7. A pump housing 402, an inclined portion 403, an inlet port 404, an end portion 405 and an outlet port 406 are provided at prescribed positions of the body 401. The top portion of the body 401 is covered with, for example, a top plate 408 in a form of closing a lid.

Figure 9:
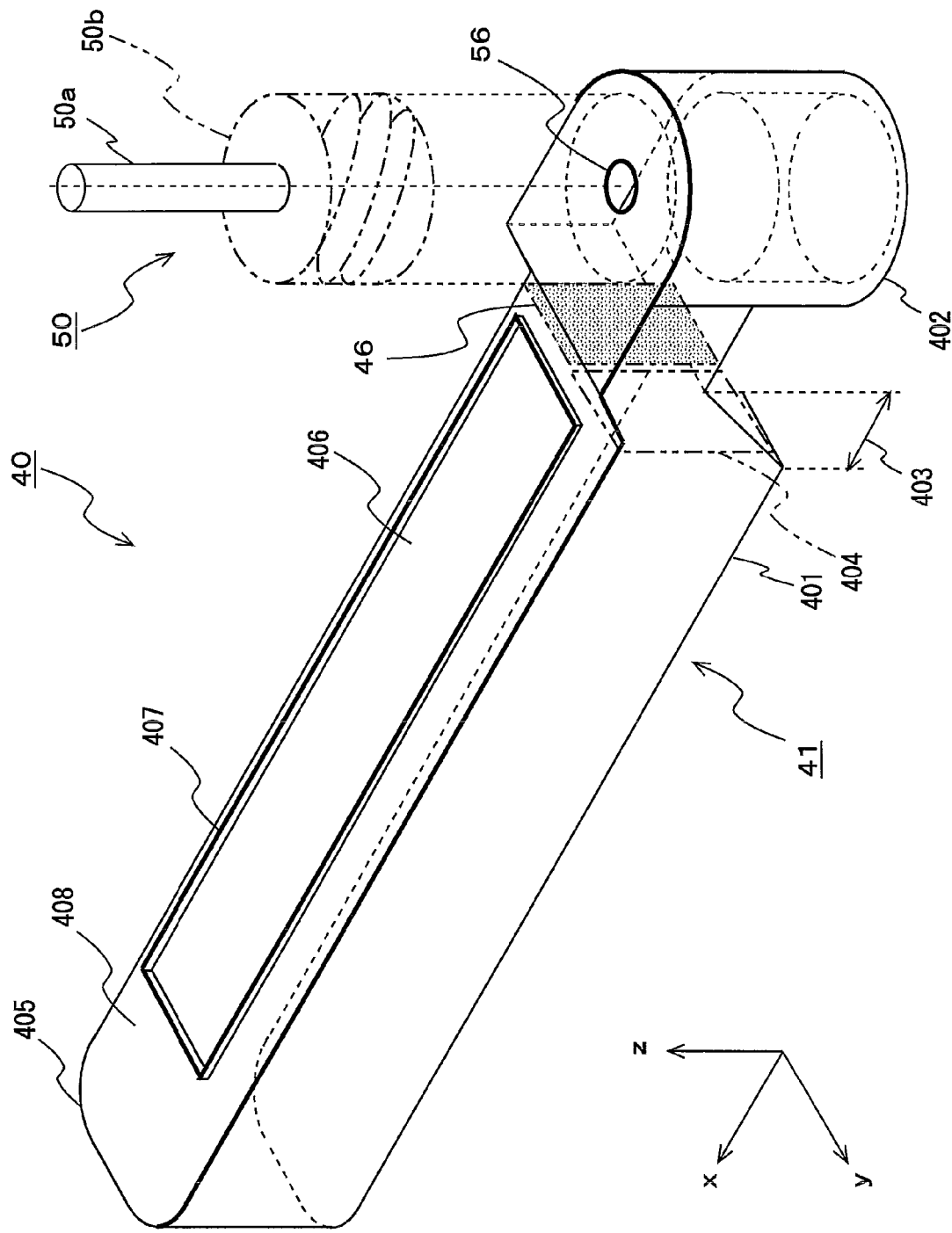
FIG. 9 is a perspective view for showing an assembling example of a duct 41 and a pump 50 thereof.

The pump housing 402 is attached to a lower portion of one side of the duct 41, and the screw 50b is rotatably attached in the pump housing 402 through the rotational shaft 50a which constitutes the pump 50 (see FIG. 9). A pulley 52 is attached to one end of the rotational shaft 50a of the pump 50 (see FIG. 6). An impeller type pump may be used as the pump 50 instead of the screw type pump.

An inclined portion 403 is placed at a part connecting between the above described body 401 and the upper portion of the pump housing 402. One end of the inclined portion 403 is connected to the upper portion of the pump housing 402 and the other end thereof acts as an inlet port 404 that is a part for carrying the molten solder 7 squeezed by the pump 50 to the duct 41. An inflow regulating plate 46 is placed at the prescribed position of the inlet port 404. For example, the inflow regulating plate 46 closes a right half portion of an opening area of the inlet port 404 to regulate the molten solder 7 to flow into the inflow port 14 having one opening width w1 of the guide vane 10.

The motor 60 is placed on the prescribed place outside the solder bath 51 and a pulley 53 is attached to a shaft portion of the motor. A belt 54 is wound between the pulley 52 of the above-described pump 50 and the pulley 53 of the motor 60. If the motor 60 rotates in a prescribed direction, the belt 54 is drawn roundly to rotate the pump 50. The pump 50 delivers the molten solder 7 into the body 401 through the inclined portion 403 and the inlet port 404. Thereby, the molten solder 7 taken from the solder bath 51 can be sent into the duct 41.

Figure 8A:
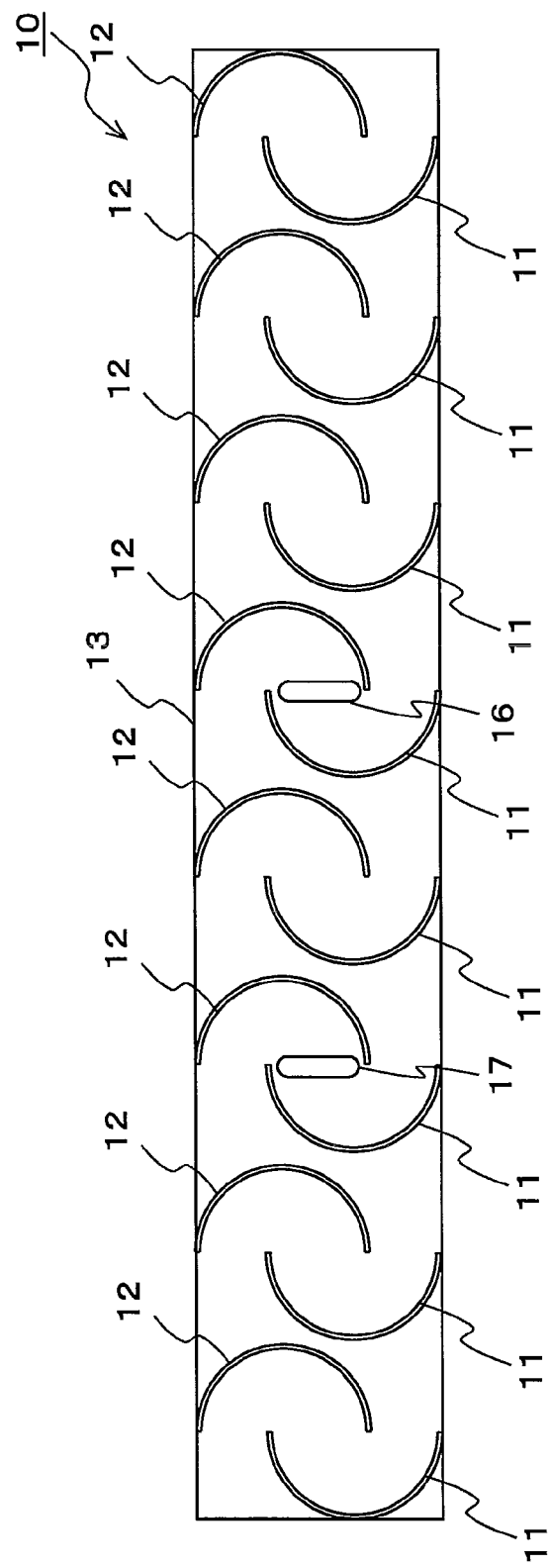
FIG. 8A is a top view for showing an assembling example of the guide vane 10 according to the jetting apparatus 40.
Figure 8B:
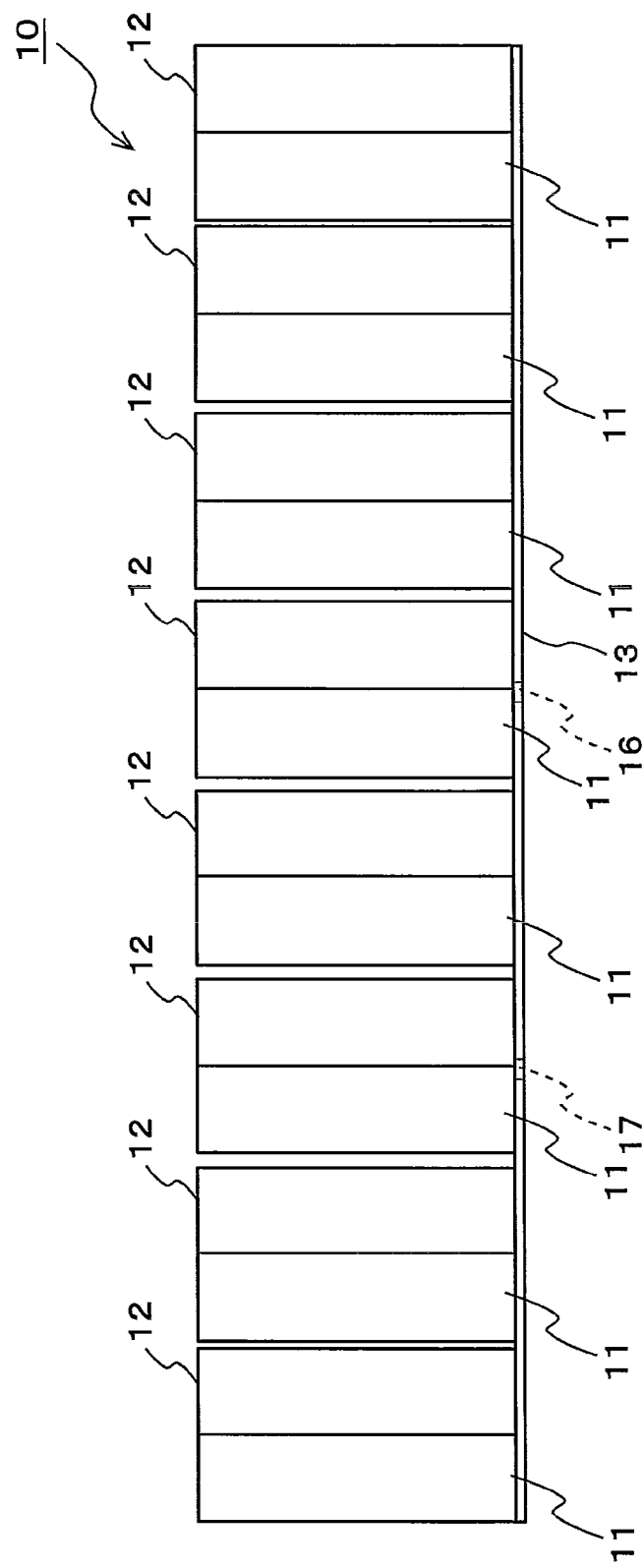
FIG. 8B is a front view for showing the assembling example of the guide vane 10 according to the jetting apparatus 40.

On the other hand, the guide vane 10 is placed in the duct 41 as shown in FIG. 8A and FIG. 8B. For example, the guide vane 10 is adjustably fixed to the bottom of the body 401 by bolts, nuts and so on. Then, it works to change the horizontal flow direction of the molten solder 7 squeezed by the pump 50 to the vertical direction. In the jetting apparatus 40, the guide vane 20 explained in the second embodiment, the guide vane 30 explained in the third embodiment or the like may be replaced with the guide vane 10.

The end portion 405 is placed at the other side of the body 401. In this example, the end portion 405 has a curved surface (R-shape) so that the end portion 405 reverses the flow direction of the molten solder 7 and the reversed molten solder 7 flows to the other inflow port 15 of the guide vane 10 having the opening width w2. Since the shape of the end portion 405 is the curved surface (R-shape), it reverses easily the fluid direction. However, it is not restricted to the curved surface (R-shape) and it may be flat. Moreover, the above-described inflow regulating plate 46 prevents the molten solder 7 reversed by the end portion 405 from flowing into the inclined portion 403.

The outlet port 406 is opened (placed) at the top plate 408 upper the above-described guide vane 10 wherein the top plate 408 covers the top portion of the body 401. The tapered nozzle 42 is connected to the outlet port 406. The nozzle 42 has the thin and long rectangular opening part 421 at its lower portion to take in the molten solder 7 and has the thin and long rectangular opening part 422 at the upper portion to jet the molten solder 7. In this example, a straightening grid 70 is placed between the guide vane 10 and the nozzle 42. This straightening grid 70 is an assembly that incorporates a wide metal plate in a grid shape (see FIG. 10) to rectifies the molten solder 7 sent from the duct 41. This straightening grid 70 is not an essential feature but may be set if necessary.

In this example, the platform 43 is attached to the top portion of the nozzle 42. The molten solder 7 is jetted to the printed circuit board 1 at the platform 43. A part comprising a combination of the nozzle 42 and the platform 43 is hereinafter referred to the nozzle home 49. They construct the wave soldering apparatus 400.

Successively, an assembling example of the wave soldering apparatus 400 will be explained with references to FIG. 8 through FIG. 11. According to the assembling example of the guide vane 10 shown in FIG. 8A, it is prepared that eight pieces of the half-cylindrical plate 11 and eight pieces of the half-cylindrical plate 12 are provided on the board 13 and two long hole portions 16, 17 are provided adjacent to a center portion of the board 13. The long hole portion 16 is placed, for example, between the fourth half-cylindrical plate 11 from right side and the fourth half-cylindrical plate 12 from right side.

The long hole portion 17 is placed between the third half-cylindrical plate 11 from the left side and the third half-cylindrical plate 12 from the left side. When the guide vane 10 is attached to the duct 41, these long hole portions 16, 17 are used for an angle adjustment and a fixing hole of the guide vane 10 (see FIG. 12A and so on). Since the assembling example of the guide vane 10 has been explained by reference to FIG. 2, it will not be further explained.

Next, the inflow regulating plate 46 and the screw type pump 50 are attached to the duct 41 shown in FIG. 9. The top plate 408 and the body 401 as is the thin and long case are prepared for the duct 41. For example, the duct 41 having the inclined portion 403 is used at a downstream side of the portion of connecting the body 401 and the pump housing 402. The end portion 405 is placed at one side of the body 401 and the pump housing 402 is placed at the other side thereof.

In addition, the outlet port 406 is opened at one side of the top plate 408 and a bearing portion 56 is placed at the other side thereof. The bearing part 56 rotatably supports the rotational shaft 50a of the pump 50. The cornice part 407 having the predetermined height is placed around the outlet port 406. The cornice part 407 is placed so as not to leak the molten solder 7 to the outside of the duct 41 and the nozzle 42 at the abutting part of the duct 41 and the nozzle 42.

First, the inflow regulating plate 46 is attached to the lower end of the inclined portion 403 to define the inlet port 404. The inflow regulating plate 46 is welded on the bottom of the body 401 in the standing form at a position, for example, of dividing the lower end of the inclined portion 403 in half. It is preferable that the sidewall of the inflow regulating plate 46 is welded to the side part of the body 401. Thereby, the inlet port 404 is defined with the configuration that the right-half opening area of the cross-section body 401 is infilled by the inflow regulating plate 46. When the molten solder 7 is flowed into the inflow port 14 of the guide vane 10 which is attached in the duct 41 in the post process, the inflow regulating plate 46 placed on the inlet port 404 comes to the regulation. Next, the pump 50 is placed in the inside of the pump housing 402 that is placed on one side of the duct 41. The pump 50 has the rotational shaft 50a and the screw 50b.

Figure 10:
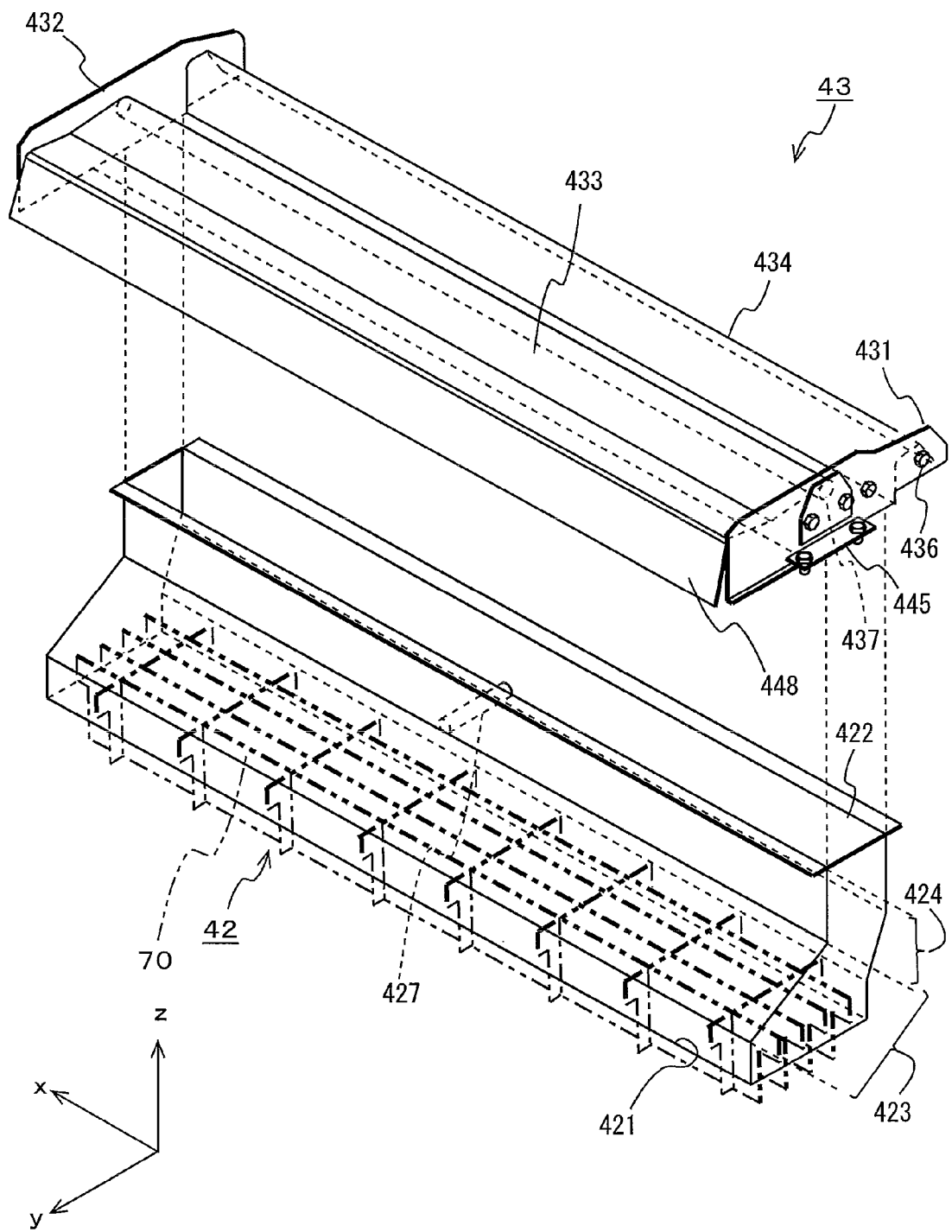
FIG. 10 is a perspective view for showing an assembling example of a nozzle 42 and a platform 43 thereof.

Successively, an assembling example of the nozzle 42 and the platform 43 of the jetting apparatus 40 will be explained with reference to FIG. 10. The nozzle 42 and the platform 43 shown in FIG. 10 are prepared. The nozzle 42 is a tapered nozzle having the thin and long rectangular opening part 421 at its lower portion and the thin and long rectangular opening part 422 at its higher place. It is preferable that the opening part 421 is formed in the size that includes the cornice part 407 around the outlet port 406 of the duct 41 shown in FIG. 9. The nozzle 42 has the inclined top plate 423 at the upper side of the guide vane 10 and the upstanding wall part 424 extended from the inclined top plate 423.

The long side part of the opening part 422 is turned to both outsides in an eaves shape in order to reinforce the opening part 422. Moreover, the reinforcing bar 427 is placed at almost the center of one upstanding wall part 424 and the other upstanding wall part 424 so that the opening part 422 reinforced in the width direction is used.

In this example, the platform 43 is attached to the upper portion of the nozzle 42. Since the nozzle 42 and the platform 43 are known from the past, the explanation thereof will be omitted. In this example, the platform 43 is incorporated in the upper portion of the nozzle 42. After that, the platform 43 is fixed to the nozzle 42. Thereby, the nozzle home 49 is made by combining the nozzle 42 and the platform 43 (see FIG. 11).

Figure 11:
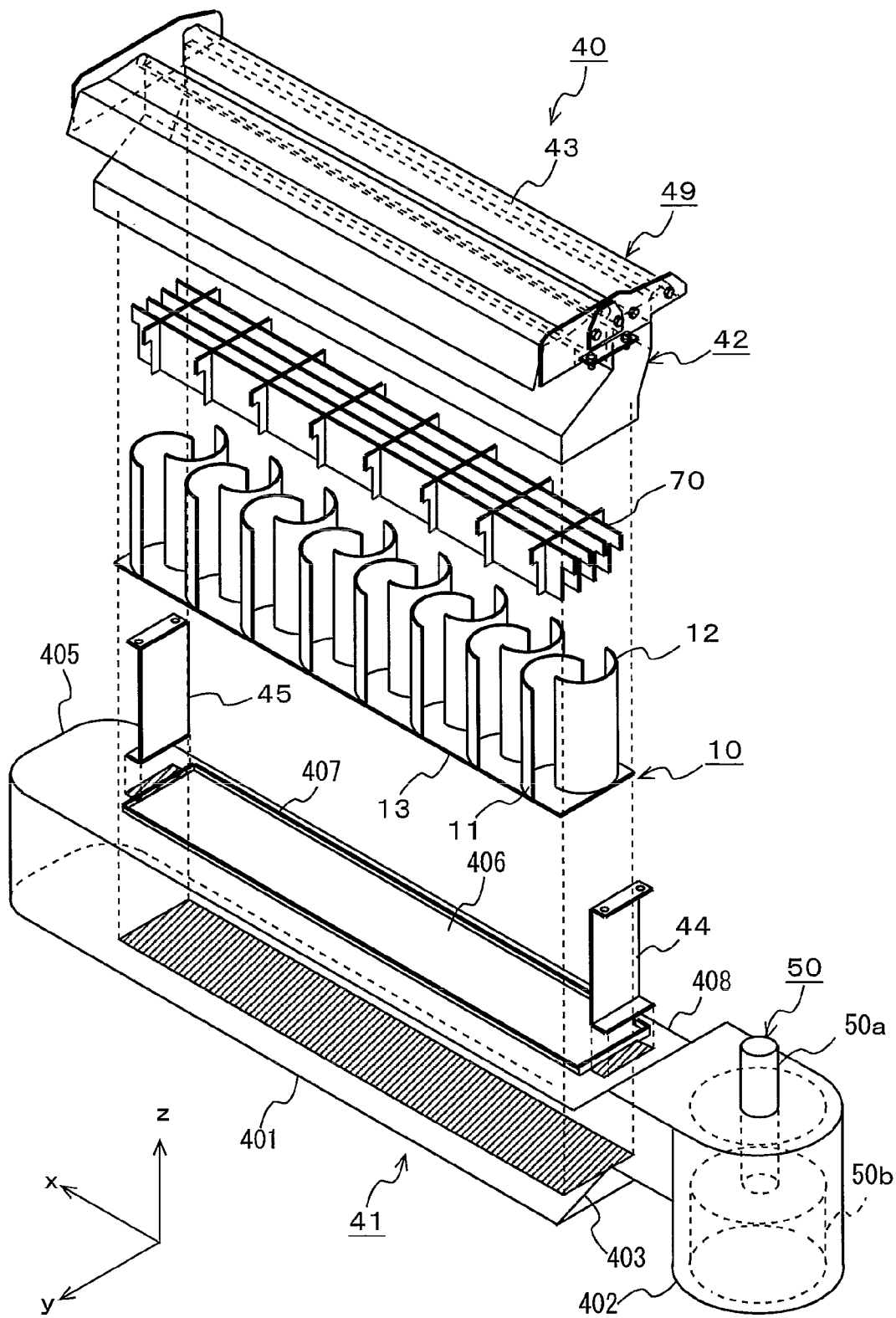
FIG. 11 is a perspective view for showing an assembling example of the duct 41, the guide vane 10 and a nozzle home 49.

Successively, an assembling example of the guide vane 10, the duct 41 and the nozzle home 49 in the jetting apparatus 40 will be explained with reference to FIG. 11. In the jetting apparatus 40 shown in FIG. 11, first, the guide vane 10 is attached to the area indicated by the hatched line in the duct 41 in this figure. The assembly in FIG. 8A or the like is used as the guide vane 10.

At this time, the attaching angle θ in the guide vane 10 can be adjusted. Here, the attaching angle θ is, for example, an angle between the longitudinal direction of the cornice part 407 of the duct 41 and the longitudinal direction of the board 13 in the guide vane 10 shown in FIG. 12B. In this example, the attaching angle θ can be adjusted by the long hole portions 16, 17 and external screws 18, 19 shown in FIG. 8A and so on. Thereby, the guide vane 10 is mounted slantingly against the duct 41 so that the flow path becomes gradually narrower (tapered) from the inlet port 404 to the end portion 405. After the attaching angle θ has been determined, the external screws 18, 19 are tightened to fix the guide vane 10 to the bottom of the duct 41 (see FIG. 12A).

Because of this adjustment of the attaching angle θ, the inflow port 14 of the half-cylindrical plate 11 is changed relatively to the molten solder 7, so the taking of the molten solder 7 can be adjusted. After that, the nozzle home 49 is attached to the duct 41 by the mounting brackets 44, 45. Thereby, the jetting apparatus 40 is completed as shown in FIG. 7. When the jetting apparatus 40 is implemented to the solder bath 51 and the motor 60 is attached, then the wave soldering apparatus 400 can be obtained as shown in FIG. 6.

Figure 12A:
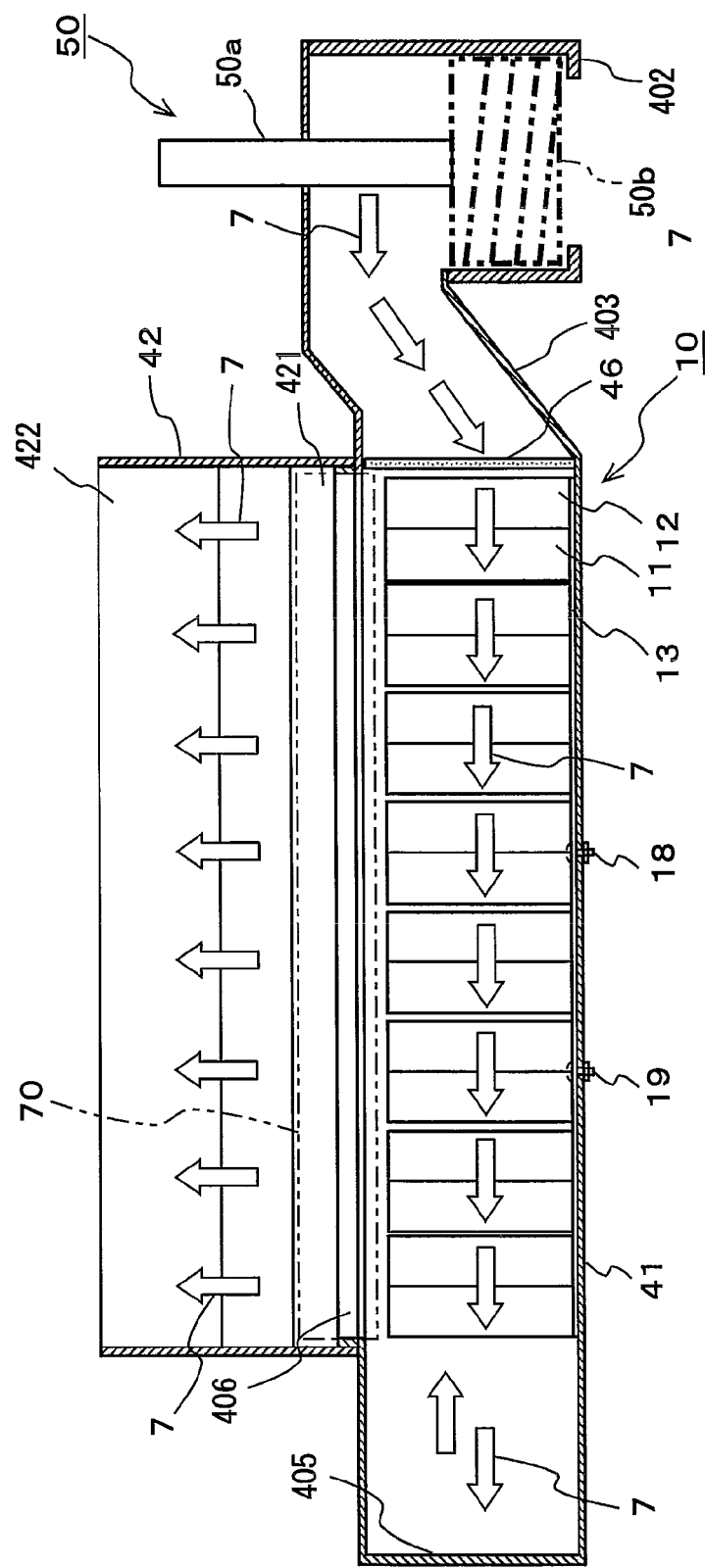
FIG. 12A is a cross sectional view for showing an operation example (Part 1) of the jetting apparatus 40.
Figure 12B:
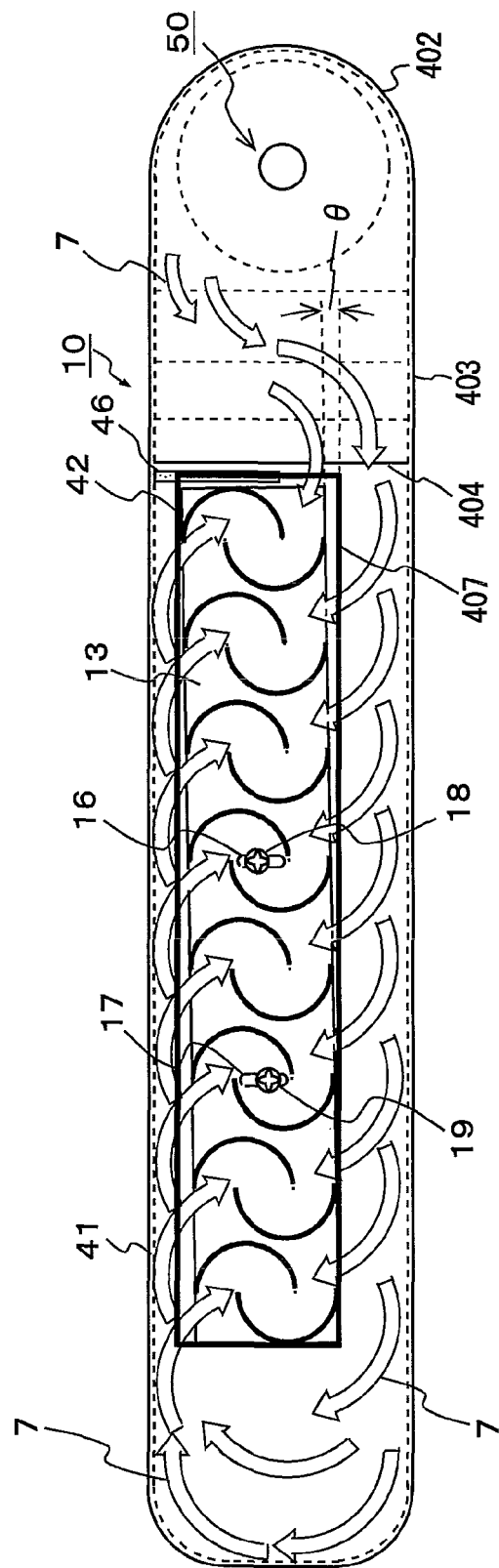
FIG. 12B is a top view for showing the operation example (Part 1) of the jetting apparatus 40.
Figure 13:
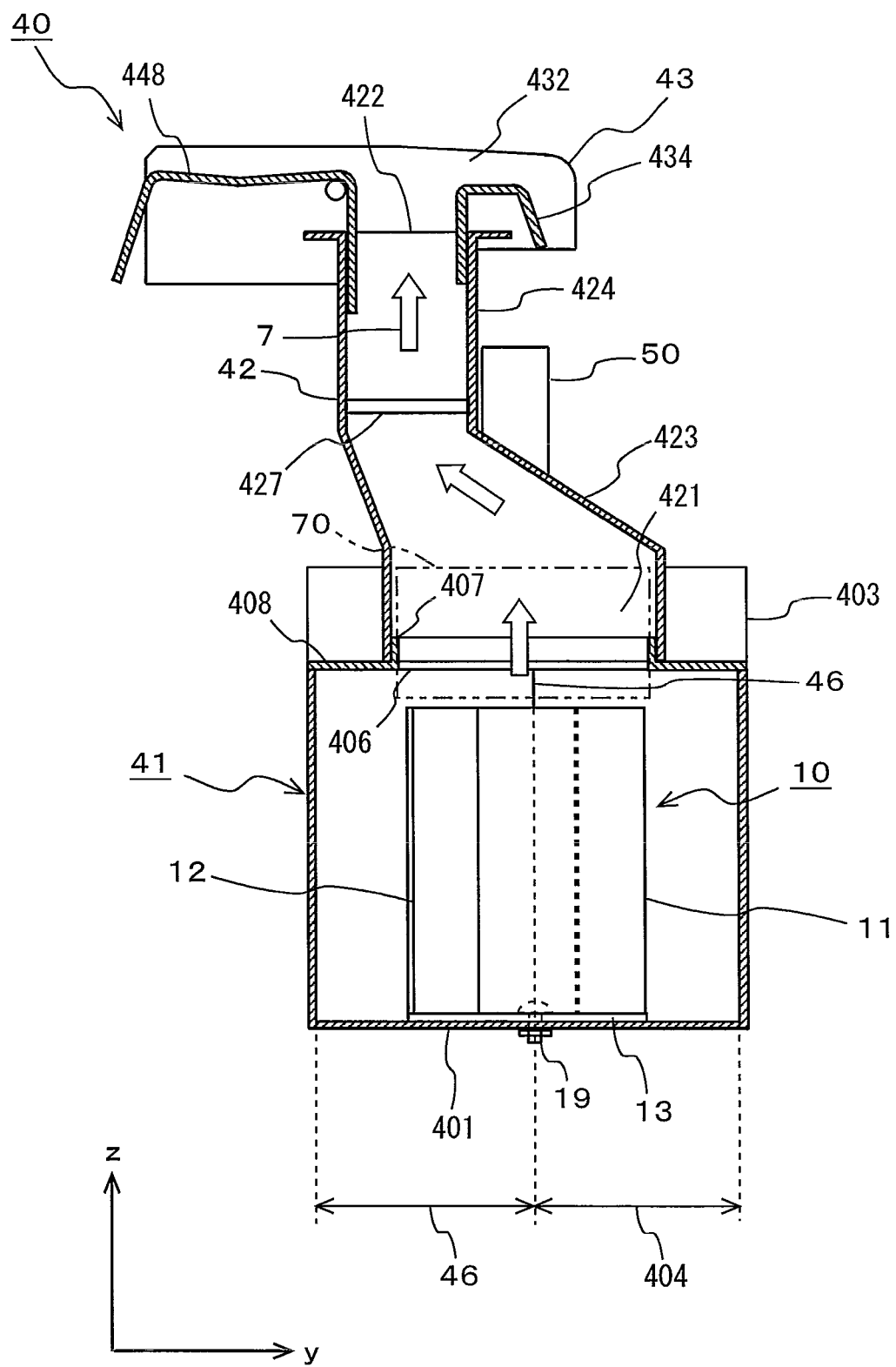
FIG. 13 is a cross sectional view for showing an operation example (Part 2) of the jetting apparatus 40.

Successively, an operation example of the jetting apparatus 40 will be explained with reference to FIGS. 12A, 12B, 13 through 15. The speed distribution map and the pressure distribution map of the jetting apparatus 40 are obtained by fluid analyzing software with the geometries of the guide vane 10, the geometries of the duct, and the ability and rotation number of the pump 50. FIGS. 12A, 12B, 13 show the states that the nozzle home 49 is removed from the jetting apparatus 40.

According to the jetting apparatus 40 of mounting the guide vane 10 shown in FIG. 12A, the molten solder 7 is sent to into the duct 41 by rotating the pump 50. At this time, the pump 50 sends the molten solder 7 into the duct 41 through the inclined portion 403 as shown by the oblique down void arrow in this figure.

Figure 3:
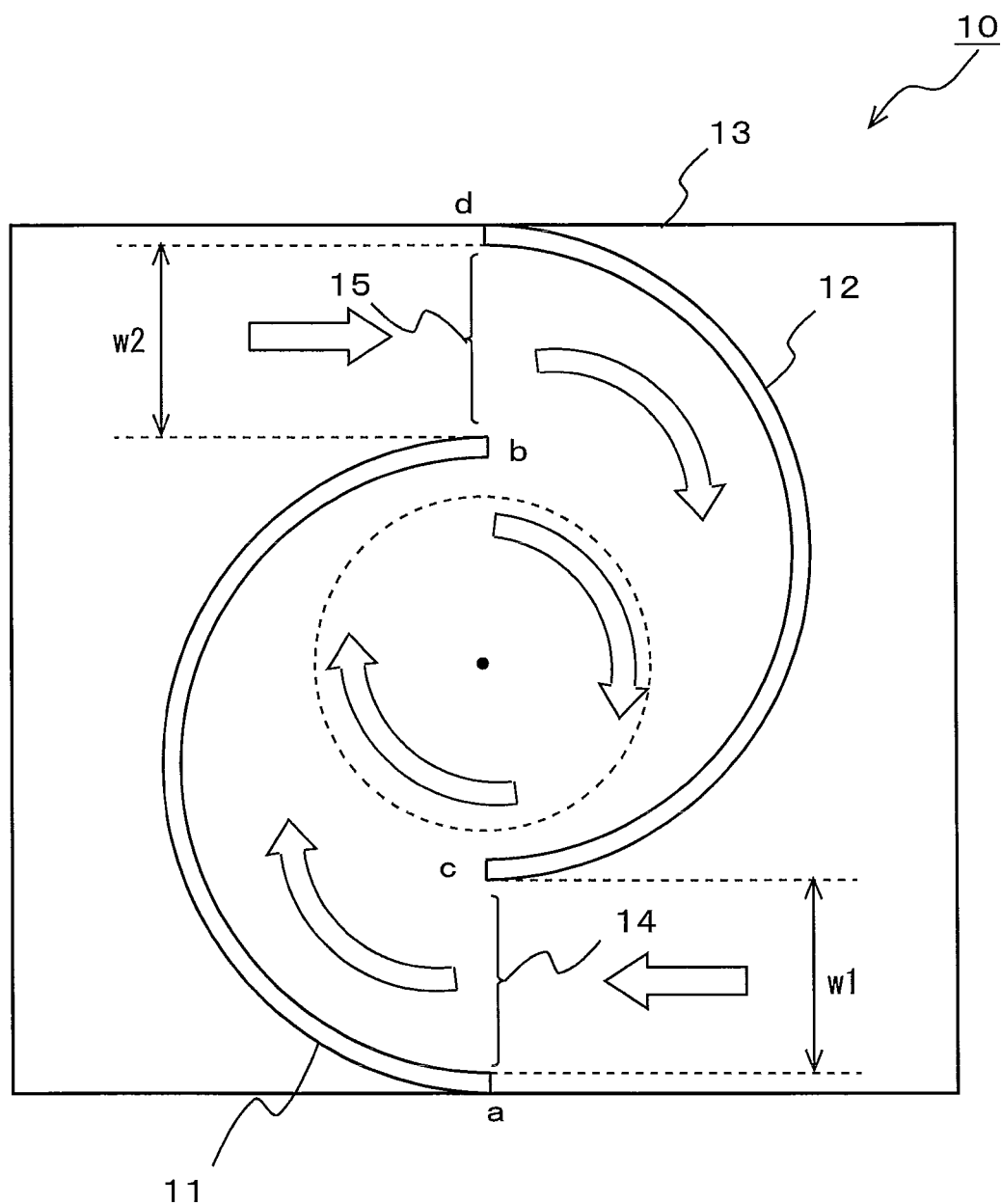
FIG. 3 is a top view for showing an operation example of the guide vane 10.

In the duct 41, the molten solder 7 flows into the eight inflow ports 14 as the arc upward void arrows shown in FIG. 12B (see FIG. 14) wherein the inflow port 14 is defined by one edge a of the half-cylindrical plate 11 and one edge c of the half-cylindrical plate 12 as shown in FIG. 3.

Figure 14:
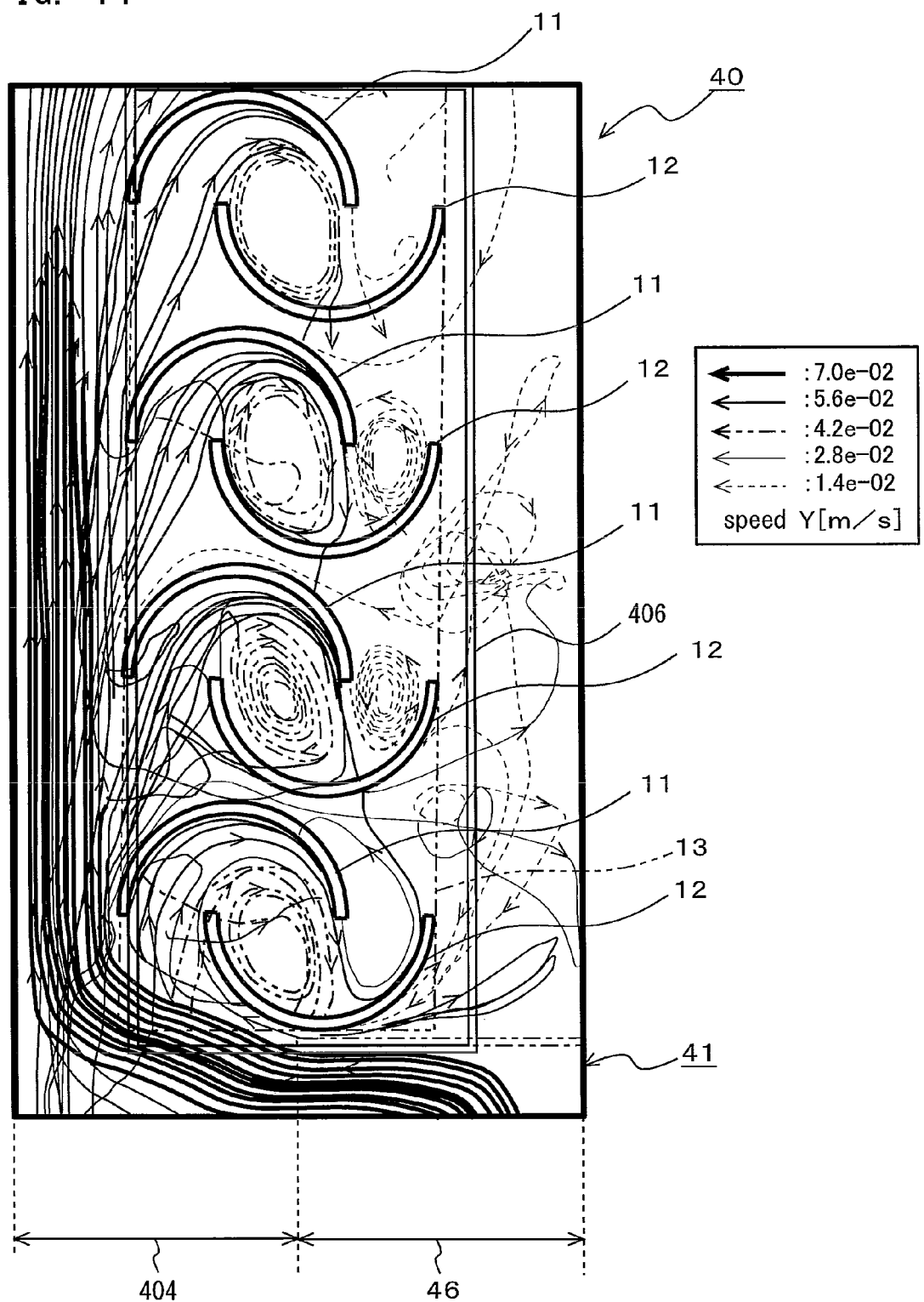
FIG. 14 is a trace drawing for showing a speed distribution example of the wave soldering apparatus 40 in a simulation analysis.

According to the speed distribution example of the jetting apparatus 40 shown in FIG. 14, in a line drawing of indicating a simulation result, full thick solid line arrows show the fastest flow speed of the molten solder 7. Middle thick solid line arrows show the second fastest flow velocities of the molten solder 7. Two-dot chain line arrows show the flow velocities of the clockwise rising spiral portion of the molten solder 7 made by the half-cylindrical plates 11, 12. Solid arrows show the slow flow velocities of the molten solder 7 that contributes little to the rising spiral.

Dashed line arrows show the slowest flow velocities of the molten solder 7. The directions of the arrows show the flow directions of the molten solder 7. Y [m/s] represents the flow speed. It is understood that the flow speed is significantly different at the front and rear surfaces of the inflow regulating plate 46. At the front surface side of the inflow regulating plate 46, the flow of the molten solder 7 is the fastest toward the inlet port 404. The flow of the molten solder 7 sent from the inlet port 404 to the inside of the duct is gradually slower.

After the molten solder 7 reaches the end portion 405 of the duct 41 shown in FIG. 12A, the molten solder 7 turns around at the R-shape of the end portion 405 and is reversed to the inflow port 15 side of the half-cylindrical plate 12. At this time, the molten solder 7 is flowed into eight inflow ports 15 as shown by the arc down void arrows in FIG. 12B wherein the inflow port 15 is defined by the edge b of the half-cylindrical plate 11 and the other edge d of the half-cylindrical plate 12 shown in FIG. 3. At that time, a part of the molten solder 7 from the inflow port 14 crosses the molten solder 7 from the inflow port 15. Therefore, the flow speed of the molten solder 7 is the slowest at the rear side of the inflow regulating plate 46 shown in FIG. 14.

The half-cylindrical plate 11 turns the horizontal flow direction of the molten solder 7 from the inflow port 14 clockwise to form a clockwise rising vortex shown by the two-dot chain line arrows in FIG. 14, and changes direction of the molten solder 7 upward by cooperating with the half-cylindrical plate 12. The half-cylindrical plate 12 also turns the flow of the horizontal molten solder 7 from the inflow port 15 clockwise in the same direction to form a clockwise rising vortex, and changes the direction of the molten solder 7 upward by cooperating with the half-cylindrical plate 11 as shown by the upward void arrows in FIG. 12A.

Figure 15:
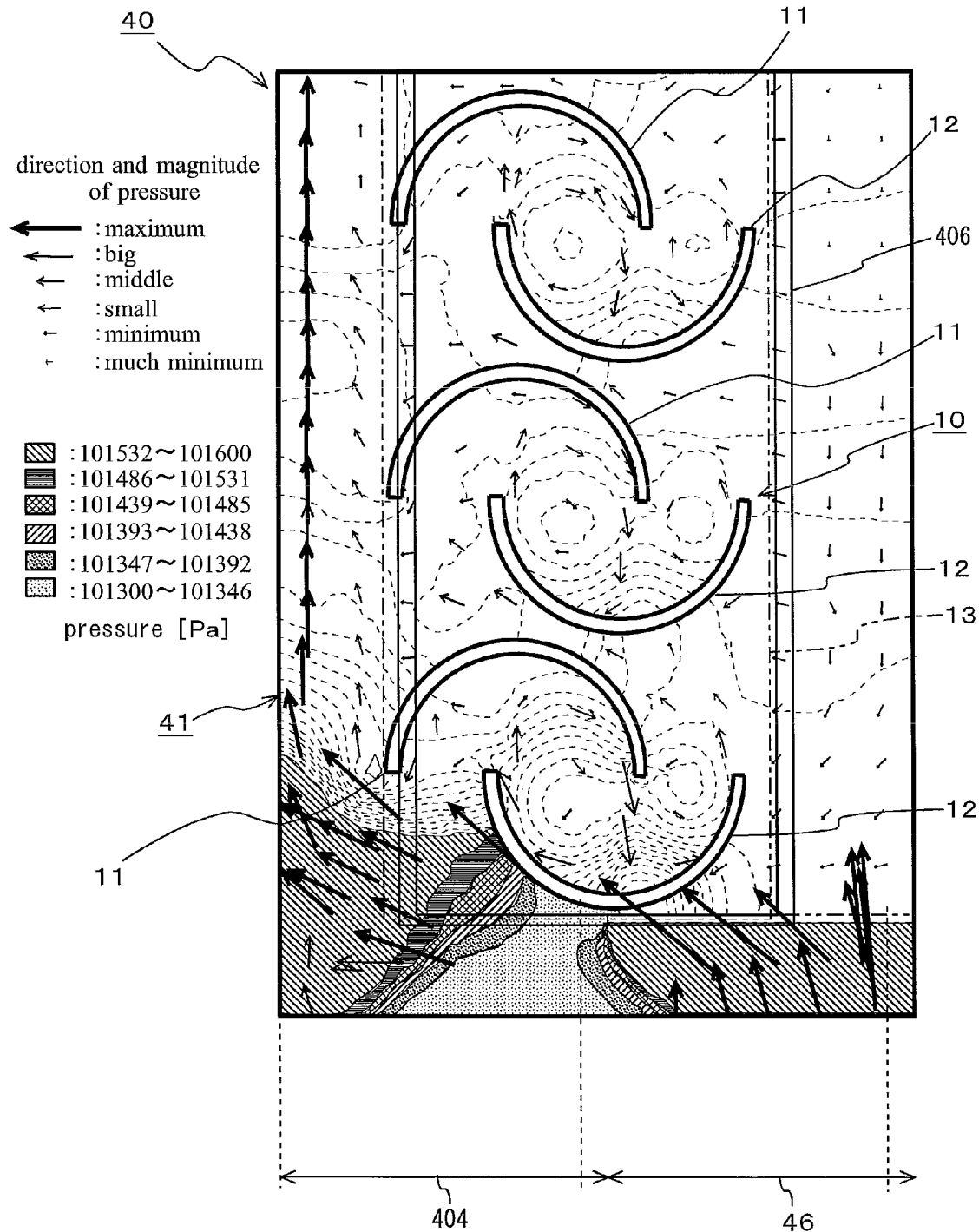
FIG. 15 is a trace drawing for showing a pressure distribution example of the wave soldering apparatus 40 in the simulation analysis.

In addition, the flow of the molten solder 7 in the inside of the pair of the half-cylindrical plates 11, 12 turns clockwise along the half-cylindrical inner surface and collides with the other half-cylindrical inner surface so that the pressure of the collision increases at that time (see FIG. 15). According to the pressure distribution example in FIG. 15, in the line drawing indicating the simulation result, the right-downward hatched areas show the highest pressures of the molten solder 7. The horizontal hatched areas show the second highest pressures of the molten solder 7. The cross-hatched areas show the third highest pressures of the molten solder 7 (for example, these areas are referred to as the middle pressure areas). The left-downward hatched areas show the pressures of the molten solder 7 lower than the middle areas. The thick dot areas show the much lower pressures of the molten solder 7. The thin dot area shows the lowest pressure of the molten solder 7.

The arrow direction shows the pressure (flow) direction of the molten solder 7. Thick long arrows show the maximum areas and their directions of the pressures. Thin and long arrows show the bigger areas and their directions of the pressures. Thin and short arrows show the middle areas and their directions of the pressures. Short extra fine arrows show the small areas and their directions of the pressures. Thin very-short arrows show the minimum areas and their directions of the pressures. Very-short extra fine arrows show that the much minimum areas and their directions of the pressure. It is understood that the pressure is significantly different at the front and rear surfaces of the regulating plate 46. At the front surface of the inflow regulating plate 46, the pressure of the molten solder 7 is the highest from the pump 50 toward the inlet port 404.

The pressure of the molten solder 7 sent from the inlet port 404 into the duct drops gradually. Dashed lines in this figure show isopiestic lines. In this example, the isopiestic lines are roughly circle in the area defined by one edge b of the half-cylindrical plate 11 and one edge c of the half-cylindrical plate 12 and the area defined by the other edge b of the half-cylindrical plate 11 and the other edge d of the half-cylindrical plate 12 shown in FIG. 3. These two areas' pressure of the guide vane 10 are higher than the pressures of the right and left areas thereof.

This increasing pressure makes the resistance against the fluid of the molten solder 7 flowing into the inside pair of the half-cylindrical plates 11, 12. Then, the faster the turning speed of the molten solder 7, the bigger the pressure becomes. Therefore, this has an effect to uniformize the amount of flow of the molten solder 7 flowing into each pair of the half-cylindrical plates 11, 12.

After changing the direction of the molten solder 7 shown in the upward void arrows of FIG. 12A, the molten solder 7 runs into the incline top plate 423 through the outlet port 406 shown in FIG. 13. Then, the molten solder 7 rises to the vertical direction at the first part of the nozzle 42, is guided obliquely upward by the incline top plate 423, and guided to the upstanding wall part 424. Then, the upstanding wall part 424 as the second part of the nozzle 42 guides the molten solder 7 upwardly. Thereby, the molten solder 7 having the same wave height can be jetted from the opening part 422 of the nozzle 42.

According to the wave soldering apparatus 400 of the fourth embodiment, the jetting apparatus 40 according to the present invention is implemented and the guide vanes 10, 20 or 30 according to the present invention are attached to the jetting apparatus 40. The guide vane 10 according to the present invention changes the flow direction of the molten solder 7 from the horizontal to the vertical while turning right in the duct 41.

This structure enables the widthwise distribution of the jetting height of the molten solder 7 jetted from the nozzle 42 to be uniformized. Further, the tendency variation in widthwise distribution of the molten solder 7 from the pump output 50 can be reduced. In addition, even if the output of the pump 50 is changed, balance of the pair of the half-cylindrical plates 11, 12 can be kept by the effect of uniformizing the flow amount of the molten solder 7 into each pair of half-cylindrical plates 11, 12. Therefore, it is possible to form the jet of the molten solder 7 having the uniform height along the width direction of the nozzle 42.

Additionally, according to the wave soldering apparatus 400, the attaching angle θ with respect to the duct 41 of the guide vane 10 can be adjusted so that the guide vane 10 can be attached to the bottom of the duct 41 at the attaching angle θ illustrated in FIG. 12B. Since the inflow port 14 of the half-cylindrical plate 11 changes relatively to the molten solder 7 by adjusting the attaching angle θ, the acquisition of the molten solder 7 can be adjusted.

The above examples have explained that the molten solder 7 into the guide vanes 10, 20, or 30 is turned clockwise, but not restricted to these cases. If the positions of the half-cylindrical plates 11, 12 of the guide vane 10 or the like are set to upside down, the molten solder 7 can turn counterclockwise.

INDUSTRIAL APPLICABILITY

This invention is extremely suitable for applying the wave soldering apparatus, etc. that changes the flow direction of the molten solder from the horizontal to the vertical for jetting the molten solder to the printed circuit board.

DESCRIPTION OF CODES

7: molten solder
10, 20, 30: guide vane
11, 12: half-cylindrical plate (first and second members)
21, 22: angle plate (first and second members)
31, 32: channel plate (first and second members)
13, 23, 33: board
14, 24, 34: first inflow port
15, 25, 35: second inflow port
40: jetting apparatus
41: duct
42: nozzle
43: platform
44, 45: mounting bracket
49: nozzle home
50: pump
51: solder bath
52, 53: pulley
54: belt
400 wave soldering apparatus

The invention claimed is:

1. A guide vane for molten solder in a soldering apparatus, the guide vane comprising:
    a board extending in a longitudinal direction of the guide vane;
    a plurality of pair structures standing on the board and aligned with one another in the longitudinal direction of the guide vane;
    each of said pair structures including a first member having a curved or angular inner surface in a view along the first member toward the board and having a first prescribed height and a first respective pair of edges, and including a second member having a curved or angular inner surface in a view along the second member toward the board and having a second prescribed height and a second respective pair of edges;
    each of said pair structures having said first and second members arranged so that respective inner surfaces of said first and second members face toward each other and an outer surface of one of said first and second members overlaps an inner surface of the other one of said first and second members in a view along said longitudinal direction, and each of said pair structures includes two inflow openings, wherein a width of each of the inflow openings is defined by an edge of one of said first and second members and an edge of the other one of said first and second members; and
    whereby a flow of the molten solder directed to said inflow openings is turned in each of said pair structures to change a direction of the flow from a horizontal direction to a vertical direction.

2. The guide vane as recited in claim 1, wherein each of said first member and said second member comprises a screen plate with either a half-cylindrical cross-section, an L-shape cross section or a U-shape cross section.

3. A jetting apparatus for molten solder, comprising:
    a nozzle having a prescribed opening for jetting molten solder;
    a duct connected to said nozzle;
    a pump for sending the molten solder into said duct;
    a pump housing containing said pump and being connected to said duct; and
    a guide vane comprising:
        a board extending in a longitudinal direction of the guide vane;
        a plurality of pair structures standing on the board and aligned with one another in the longitudinal direction of the guide vane;
        each of said pair structures including a first member having a curved or angular inner surface in a view along the first member toward the board and having a first prescribed height and a first respective pair of edges, and including a second member having a curved or angular inner surface in a view along the second member toward the board and having a second prescribed height and a second respective pair of edges;

each of said pair structures having said first and second members arranged so that respective inner surfaces of said first and second members face toward each other and an outer surface of one of said first and second members overlaps an inner surface of the other one of said first and second members in a view along said longitudinal direction, and each of said pair structures includes two inflow openings, wherein a width of each of the inflow openings is defined by an edge of one of said first and second members and an edge of the other one of said first and second members;

whereby a flow of the molten solder directed to said inflow openings is turned in each of said pair structures to change a direction of the flow from a horizontal direction to a vertical direction, said guide vane being provided in said duct and located so as to turn the direction of the flow of the molten solder sent by said pump and flowing in a longitudinal direction of said duct to change the direction of the flow of the molten solder to a height direction of said nozzle.

4. The jetting apparatus as recited in claim 3, wherein said duct is connected to said pump housing, the molten solder is sent by said pump, an angle between the longitudinal direction of said duct and the longitudinal direction of said guide vane is set, and said guide vane is attached to said duct at the set angle.

5. The jetting apparatus as recited in claim 4 characterized in that:
said duct, to which the molten solder is sent by said pump, includes a thin and long case having an inlet port, an outlet port, and an end portion that are provided in prescribed places;
said inlet port is provided on one side of said case and said pump housing is connected to said inlet port;
an inflow regulating plate is provided on a prescribed place of said inlet port for regulating the molten solder to flow through the inlet port into the opening of said guide vane;
said outlet port is positioned above said guide vane, opened at a top plate of said case and connected with said nozzle; and wherein
the end portion is located at an end of said case opposite said inlet port, in position to reverse the direction of flow of the molten solder so that the molten solder is made to flow into a second opening of said guide vane.

6. The jetting apparatus as recited in claim 5, wherein an inclined portion is provided in a part connecting said pump housing and said duct, and wherein said pump sends the molten solder into said duct through said inclined portion.

7. The jetting apparatus of claim 3, wherein each of said first member and said second member comprises a screen plate with either a half-cylindrical cross-section, an L-shape cross section or a U-shape cross section.

8. The jetting apparatus as recited in claim 7, wherein said duct is connected to said pump housing, the molten solder is sent by said pump, an angle between the longitudinal direction of said duct and the longitudinal direction of said guide vane is set, and said guide vane is attached to said duct at the set angle.

9. The jetting apparatus as recited in claim 8 characterized in that:
said duct, to which the molten solder is sent by said pump, includes a thin and long case having an inlet port, an outlet port, and an end portion that are provided in prescribed places;
said inlet port is provided on one side of said case and said pump housing is connected to said inlet port;
an inflow regulating plate is provided on a prescribed place of said inlet port for regulating the molten solder to flow through the inlet port into the inflow opening of said guide vane;
said outlet port is positioned above said guide vane, opened at a top plate of said case and connected with said nozzle; and wherein
the end portion is located at an end of said case opposite said inlet port, in position to reverse the direction of flow of the molten solder so that the molten solder is made to flow into the inflow opening of said guide vane.

10. The jetting apparatus as recited in claim 9, wherein an inclined portion is provided in a part connecting said pump housing and said duct, and wherein said pump sends the molten solder into said duct through said inclined portion.

* * * * *